US012563953B2

(12) United States Patent
Cho et al.

(10) Patent No.: US 12,563,953 B2
(45) Date of Patent: Feb. 24, 2026

(54) WEARABLE DEVICE COMPRISING DISPLAY PANEL

(71) Applicant: Samsung Electronics Co., Ltd., Suwon-si (KR)

(72) Inventors: Joungmin Cho, Suwon-si (KR); Kwangtai Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 18/930,298

(22) Filed: Oct. 29, 2024

(65) Prior Publication Data

US 2025/0057023 A1     Feb. 13, 2025

Related U.S. Application Data

(63) Continuation of application No. PCT/KR2023/007305, filed on May 26, 2023.

(30) Foreign Application Priority Data

Jul. 5, 2022     (KR) ........................ 10-2022-0082301
Aug. 29, 2022     (KR) ........................ 10-2022-0108438

(51) Int. Cl.
 *H10K 59/80*          (2023.01)
 *G02B 5/30*          (2006.01)
       (Continued)

(52) U.S. Cl.
 CPC ....... *H10K 59/8791* (2023.02); *G02B 5/3016* (2013.01); *G06F 3/013* (2013.01);
       (Continued)

(58) Field of Classification Search
 CPC .............. G02B 27/0172; G02B 5/3016; G02B 27/0018; G02B 27/283; G02B 27/0093;
       (Continued)

(56) References Cited

U.S. PATENT DOCUMENTS 7,339,316 B2 *    3/2008    Adachi .............. H10K 59/8791
                                                          313/506
7,425,794 B2 *    9/2008    Adachi ................ G02B 5/3016
                                                          349/115
       (Continued)

FOREIGN PATENT DOCUMENTS

KR     10-2010-0085732 A     7/2010
KR     10-2011-0042950 A     4/2011
       (Continued)

OTHER PUBLICATIONS

Extended European Search Report dated Jul. 8, 2025, issued in a European Patent Application No. 23835690.1.
       (Continued)

*Primary Examiner* — Vinh T Lam
(74) *Attorney, Agent, or Firm* — Jefferson IP Law, LLP

(57)     ABSTRACT

A wearable device is provided. The wearable device includes a display panel which includes a plurality of light-emitting devices, a substrate on which the plurality of light-emitting devices is disposed, a pixel define layer (PDL) bank surrounding and partitioning each of the plurality of light-emitting devices to define a plurality of subpixel areas, and a cholesteric liquid crystal (CLC) film disposed on the substrate and configured to convert light output from the plurality of light-emitting devices into circularly polarized light, wherein each of the plurality of light-emitting devices include an organic film layer, an upper electrode disposed on the organic film layer and the PDL bank, and a lower electrode disposed under the organic film layer and the PDL bank, and wherein the PDL bank includes a first surface perpendicular to the substrate, surrounding a portion of an outer peripheral surface of each of the plurality of light-emitting devices, and a second surface facing the CLC film and parallel to the substrate.

20 Claims, 13 Drawing Sheets

(51) Int. Cl.
    *G06F 3/01*         (2006.01)
    *H04N 23/90*      (2023.01)
    *H10K 59/122*     (2023.01)

(52) U.S. Cl.
    CPC ........... *H04N 23/90* (2023.01); *H10K 59/122*
        (2023.02); *H10K 59/8052* (2023.02)

(58) Field of Classification Search
    CPC ..... G06F 3/013; G06F 1/163; H10K 59/8793;
        H10K 59/122; H10K 59/8791; H10K
        59/8052; H04N 23/90
    See application file for complete search history.

(56)         References Cited

U.S. PATENT DOCUMENTS

| | | | | |
|---|---|---|---|---|
| 7,732,809 | B2 * | 6/2010 | Adachi | ................. H10D 86/00 |
| | | | | 257/E33.072 |
| 7,985,113 | B2 * | 7/2011 | Choi | ................. H10K 59/8791 |
| | | | | 427/163.1 |
| 8,120,241 | B2 * | 2/2012 | Lee | ...................... C23C 14/048 |
| | | | | 313/504 |
| 8,198,804 | B2 * | 6/2012 | Adachi | ................. H05B 33/22 |
| | | | | 313/506 |
| 8,368,080 | B2 * | 2/2013 | Adachi | ................. H10D 86/00 |
| | | | | 257/40 |
| 12,268,051 | B2 * | 4/2025 | Lee | ...................... H10K 59/123 |
| 2002/0093284 | A1 * | 7/2002 | Adachi | ............. H10K 59/8791 |
| | | | | 313/506 |
| 2004/0051445 | A1 * | 3/2004 | Adachi | ............... G02B 5/3016 |
| | | | | 313/504 |
| 2004/0189167 | A1 * | 9/2004 | Adachi | ................. H10K 59/38 |
| | | | | 313/112 |

| | | | | |
|---|---|---|---|---|
| 2008/0007155 | A1 * | 1/2008 | Adachi | ................. H05B 33/22 |
| | | | | 313/498 |
| 2008/0143253 | A1 * | 6/2008 | Adachi | ................. H10K 59/38 |
| | | | | 313/504 |
| 2009/0072731 | A1 * | 3/2009 | Adachi | ............. H10K 59/8791 |
| | | | | 313/504 |
| 2010/0182552 | A1 | 7/2010 | Park et al. | |
| 2014/0008618 | A1 | 1/2014 | Lim et al. | |
| 2014/0346468 | A1 | 11/2014 | Kim | |
| 2017/0125743 | A1 * | 5/2017 | Kim | ................... H10K 59/8791 |
| 2018/0006274 | A1 * | 1/2018 | Kim | ....................... H10K 59/38 |
| 2022/0367840 | A1 * | 11/2022 | Lee | ................... H10D 30/6745 |
| 2023/0333380 | A1 * | 10/2023 | Chen | ................... H01L 25/167 |

FOREIGN PATENT DOCUMENTS

| | | | |
|---|---|---|---|
| KR | 10-2014-0014685 | A | 2/2014 |
| KR | 10-2014-0139427 | A | 12/2014 |
| KR | 10-2016-0096237 | A | 8/2016 |
| KR | 10-2018-0135342 | A | 12/2018 |
| KR | 10-2019-0070527 | A | 6/2019 |
| KR | 10-2019-0116193 | A | 10/2019 |
| KR | 10-2021-0120920 | A | 10/2021 |
| KR | 10-2328276 | B1 | 11/2021 |
| KR | 10-2334953 | B1 | 12/2021 |
| KR | 10-2365610 | B1 | 2/2022 |
| WO | 2021/141725 | A1 | 7/2021 |

OTHER PUBLICATIONS

International Search Report dated Sep. 4, 2023, issued in International Patent Application No. PCT/KR2023/007305.

* cited by examiner

WEARABLE DEVICE COMPRISING DISPLAY PANEL

CROSS-REFERENCE TO RELATED APPLICATION(S)

This application is a continuation application, claiming priority under § 365 (c), of an International application No. PCT/KR2023/007305, filed on May 26, 2023, which is based on and claims the benefit of a Korean patent application number 10-2022-0082301, filed on Jul. 5, 2022, in the Korean Intellectual Property Office, and of a Korean patent application number 10-2022-0108438, filed on Aug. 29, 2022, in the Korean Intellectual Property Office, the disclosure of each of which is incorporated by reference herein in its entirety.

BACKGROUND

1. Field

The disclosure relates to a wearable device including a display panel.

2. Description of Related Art

A wearable device, worn on the body of a user, may generate and display a virtual image in front of the user through a display panel to provide various information.

For example, the wearable device may provide the user with virtual reality (VR), mixed reality (MR), or extended reality (XR) experiences. The wearable device may thus be used in various industrial fields.

The above information is presented as background information only to assist with an understanding of the disclosure. No determination has been made, and no assertion is made, as to whether any of the above might be applicable as prior art with regard to the disclosure.

SUMMARY

Wearable devices are equipped with displays with performance that have been improved to provide users with clearer and more realistic imaging experiences. Wearable devices have also become thinner, smaller, or lighter to satisfy the needs of users for easier and more convenient wearability.

Aspects of the disclosure are to address at least the above-mentioned problems and/or disadvantages and to provide at least the advantages described below. Accordingly, an aspect of the disclosure is to provide a wearable device including a display panel may be effective in thinning and downsizing a display panel and may provide clearer image quality or color reproduction.

Additional aspects will be set forth in part in the description which follows and, in part, will be apparent from the description, or may be learned by practice of the presented embodiments.

In accordance with an aspect of the disclosure, a wearable device including a display panel is provided. The display panel includes a plurality of light-emitting devices, a substrate on which the plurality of light-emitting devices is disposed, a pixel define layer (PDL) bank surrounding and partitioning each of the plurality of light-emitting devices to define a plurality of subpixel areas, and a cholesteric liquid crystal (CLC) film disposed on the substrate and configured to convert light output from the plurality of light-emitting devices into circularly polarized light, wherein each of the plurality of light-emitting devices includes an organic film layer, an upper electrode disposed on the organic film layer and the PDL bank, and a lower electrode disposed under the organic film layer and the PDL bank, wherein The PDL bank includes a first surface perpendicular to the substrate, surrounding a portion of an outer peripheral surface of each of the plurality of light-emitting devices, and a second surface facing the CLC film and parallel to the substrate.

In accordance with another aspect of the disclosure, a display panel is provided. The display panel includes a plurality of light-emitting devices, a substrate on which the plurality of light-emitting devices is disposed, a PDL bank surrounding and partitioning each of the plurality of light-emitting devices to define a plurality of subpixel areas, and a CLC film disposed on the substrate and configured to convert light output from the plurality of light-emitting devices into circularly polarized light, wherein each of the plurality of light-emitting devices includes an organic film layer, an upper electrode disposed on the organic film layer and the PDL bank, and a lower electrode disposed under the organic film layer and the PDL bank, wherein the PDL bank includes a first surface perpendicular to the substrate, surrounding a portion of an outer peripheral surface of each of the plurality of light-emitting devices, a second surface facing the CLC film and parallel to the substrate, and a third surface surrounding a portion of the outer peripheral surface of each of the plurality of light-emitting devices that is different from the first surface, inclined at a predetermined angle from the substrate, and extending from one light-emitting device to another adjacent light-emitting device. and wherein the upper electrode includes a reflective electrode disposed on the second surface of the PDL bank and configured to reflect light reflected by the CLC film, and a connecting electrode disposed on the organic film layer and the third surface and connecting the plurality of light-emitting devices.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

DETAILED DESCRIPTION

Figure 1:
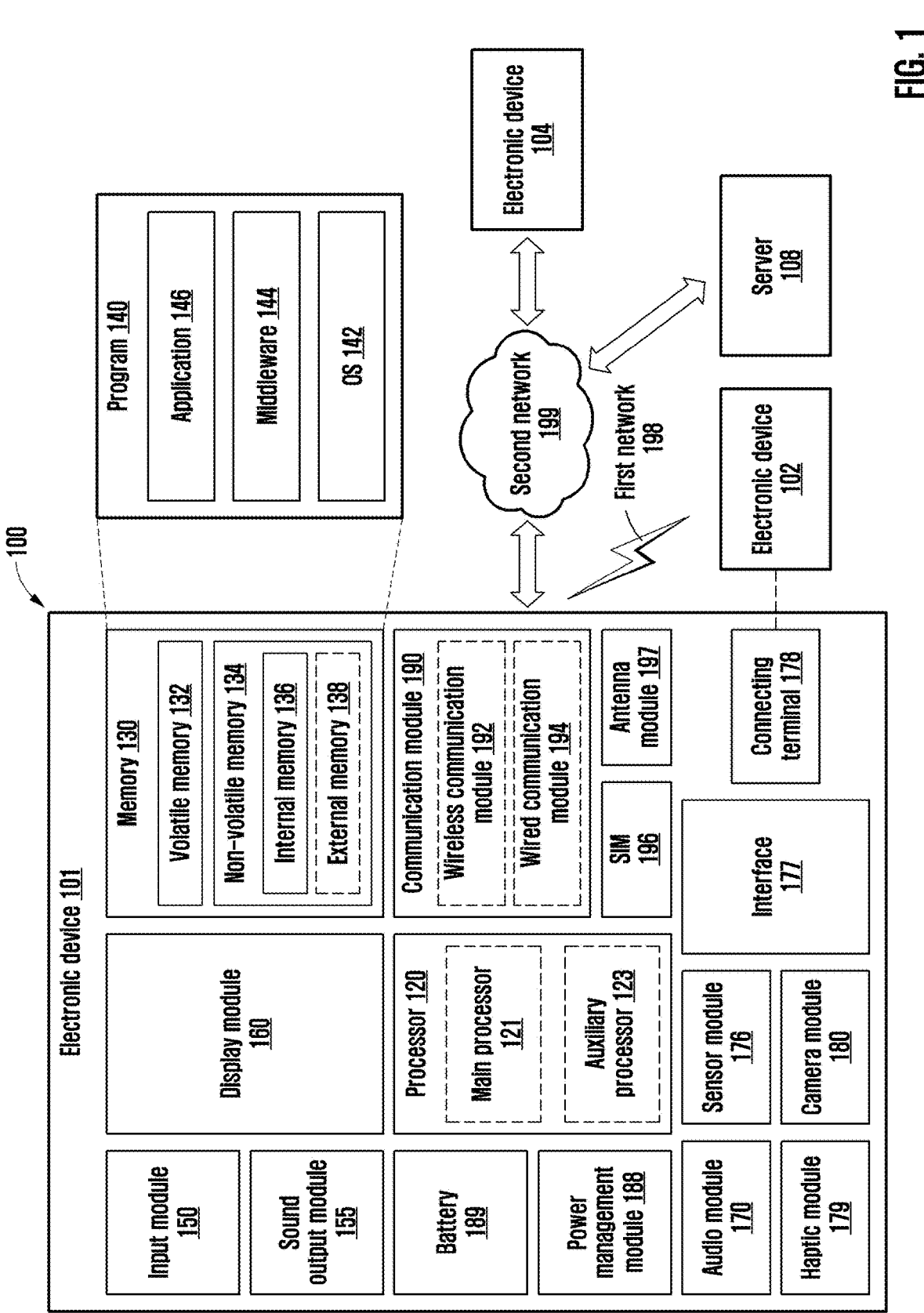
FIG. 1 is a block diagram illustrating an electronic device in a network environment according to an embodiment of the disclosure.

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

As used herein, "A or B," "at least one of A and B," "at least one of A or B," "A, B, or C," "at least one of A, B, and C," and "A, B, or C," each of which may include any one of the items listed together in the corresponding one of the phrases, or all possible combinations thereof. Terms, such as "first," "second," or "initial" or "next" or "subsequent" may simply be used to distinguish the component from other components in question, and do not limit the components in other aspects (e.g., importance or order). It is to be understood that if a component (e.g., a first component) is referred to, with or without the term "operatively" or "communicatively," as "coupled with," "coupled to," "connected with,"

or "connected to" another component (e.g., a second component), it means that the component may be coupled with the other component directly (e.g., by wire), wirelessly, or via a third component.

As used in connection with various embodiments of the disclosure, the term "module" may include a unit implemented in hardware, software, or firmware, and may interchangeably be used with other terms, for example, "logic," "logic block," "part," or "circuitry." A module may be a single integral component, or a minimum unit or part thereof, adapted to perform one or more functions. For example, according to an embodiment of the disclosure, the module may be implemented in the form of an application-specific integrated circuit (ASIC).

Various embodiments set forth herein may be implemented as software (e.g., a program 140) including one or more instructions that are stored in a storage medium (e.g., internal memory 136 or external memory 138) that is readable by a machine (e.g., an electronic device). For example, a processor of a device (e.g., the electronic device) may invoke at least one of the one or more instructions stored in the storage medium and execute it. This allows the machine to be operated to perform at least one function according to the at least one instruction invoked. The one or more instructions may include code generated by a compiler or code executable by an interpreter. The machine-readable storage medium may be provided in the form of a non-transitory storage medium. Here, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to various embodiments of the disclosure, a method according to an embodiment of the disclosure may be included and provided in a computer program product. The computer program product may be traded as a product between a seller and a buyer. The computer program product may be distributed in the form of a machine-readable storage medium (e.g., compact disc read-only memory (CD-ROM)), or be distributed (e.g., downloaded or uploaded) online via an application store (e.g., PlayStore™) or between two user devices (e.g., smartphones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities, and some of the multiple entities may be separately disposed in different components. According to various embodiments of the disclosure, one or more of the above-described components or operations may be omitted, or one or more other components or operations may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

It should be appreciated that the blocks in each flowchart and combinations of the flowcharts may be performed by one or more computer programs which include computer-executable instructions. The entirety of the one or more computer programs may be stored in a single memory device or the one or more computer programs may be divided with different portions stored in different multiple memory devices.

Any of the functions or operations described herein can be processed by one processor or a combination of processors. The one processor or the combination of processors is circuitry performing processing and includes circuitry like an application processor (AP, e.g., a central processing unit (CPU)), a communication processor (CP, e.g., a modem), a graphical processing unit (GPU), a neural processing unit (NPU) (e.g., an artificial intelligence (AI) chip), a wireless-fidelity (Wi-Fi) chip, a Bluetooth™ chip, a global position-ing system (GPS) chip, a near field communication (NFC) chip, connectivity chips, a sensor controller, a touch con-troller, a finger-print sensor controller, a display drive inte-grated circuit (IC), an audio CODEC chip, a universal serial bus (USB) controller, a camera controller, an image pro-cessing IC, a microprocessor unit (MPU), a system on chip (SoC), an IC, or the like.

FIG. 1 is a block diagram illustrating an electronic device in a network environment according to an embodiment of the disclosure.

Referring to FIG. 1, an electronic device 101 in a network environment 100 may communicate with an external elec-tronic device 102 via a first network 198 (e.g., a short-range wireless communication network), or communicate with at least one of an external electronic device 104 and a server 108 via a second network 199 (e.g., a long-range wireless communication network). The electronic device 101 may communicate with the external electronic device 104 via the server 108. The electronic device 101 may include a pro-cessor 120, memory 130, an input module 150, at least one sound output module 155, a display module 160, an audio module 170, a sensor module 176, an interface 177, a connecting terminal 178, a haptic module 179, a camera module 180, a power management module 188, a battery 189, a communication module 190, a subscriber identifica-tion module (SIM) 196, or an antenna module 197. In various embodiments of the disclosure, at least one (e.g., the connecting terminal 178) of the above components may be omitted from the electronic device 101, or one or more other components may be added to the electronic device 101. In various embodiments of the disclosure, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an embodiment of the disclosure, as at least a part of data processing or computation, the processor 120 may store a command or data received from another component (e.g., the sensor module 176 or the communication module 190) in volatile memory 132, process the command or data stored in the volatile memory 132, and store resulting data in non-volatile memory 134. The processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is oper-able independently from, or in conjunction with, the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). The auxiliary processor 123 (e.g., an ISP or a CP) may be implemented as a portion of another component (e.g., the camera module 180 or the communication module 190) that is functionally related to the auxiliary processor 123. The auxiliary processor 123 (e.g., an NPU) may include a hardware structure specifically for artificial intelligence (AI) model processing. An AI model may be generated by machine learning. The learning may be performed by, for example, the electronic device 101, in which the AI model is performed, or performed via a separate server (e.g., the server 108). Learning algorithms may include, but are not limited to, for example, supervised learning, unsupervised learning, semi-supervised learning, or reinforcement learning. The AI model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), a bidirec-tional recurrent deep neural network (BRDNN), a deep Q-network, or a combination of two or more thereof, but is not limited thereto. The AI model may alternatively or additionally include a software structure other than the hardware structure.

The memory 130 may store various pieces of data used by at least one component (e.g., the processor 120 or the sensor module 176) of the electronic device 101. The various pieces of data may include, for example, software (e.g., the pro-gram 140) and input data or output data for a command related thereto. The memory 130 may include the volatile memory 132 or the non-volatile memory 134.

The program 140 may be stored as software in the memory 130 and may include, for example, an operating system (OS) 142, middleware 144, or an application 146.

The input module 150 may receive, from outside (e.g., a user) the electronic device 101, a command or data to be used by another component (e.g., the processor 120) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing a recording. The receiver may be used to receive an incoming call. The receiver may be implemented separately from the speaker or as a part of the speaker.

The display module 160 may visually provide information to the outside (e.g., a user) of the electronic device 101. The display module 160 may include, for example, a display, a hologram device, or a projector, and control circuitry to control its corresponding one of the display, the hologram device, and the projector. The display module 160 may include a touch sensor adapted to detect a touch, or a pressure sensor adapted to measure an intensity of a force of the touch.

The audio module 170 may convert sound into an electrical signal or vice versa. The audio module 170 may obtain the sound via the input module 150 or output the sound via the sound output module 155 or an external electronic device (e.g., the external electronic device 102, such as a speaker or headphones) directly or wirelessly connected to the electronic device 101.

The sensor module 176 may detect an operational state (e.g., power or temperature) of the electronic device 101 or an environmental state (e.g., a state of a user) external to the electronic device 101 and generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used by the electronic device 101 to couple with an external electronic device (e.g., the external electronic device 102) directly (e.g., by wire) or wirelessly. The interface 177 may include, for example, a high-definition multimedia interface (HDMI), a universal serial bus (USB) interface, a secure digital (SD) card interface, or an audio interface.

The connecting terminal 178 may include a connector via which the electronic device 101 may physically connect to an external electronic device (e.g., the external electronic device 102). The connecting terminal 178 may include, for example, an HDMI connector, a USB connector, an SD card connector, or an audio connector (e.g., a headphones connector).

The haptic module 179 may convert an electrical signal into a mechanical stimulus (e.g., a vibration or a movement) or an electrical stimulus, which may be recognized by a user via their tactile sensation or kinesthetic sensation. The haptic module 179 may include, for example, a motor, a piezoelectric element, or an electric stimulator.

The camera module 180 may capture a still image and moving images. The camera module 180 may include one or more lenses, image sensors, ISPs, and flashes.

The power management module 188 may manage power supplied to the electronic device 101. The power management module 188 may be implemented as, for example, at least a part of a power management integrated circuit (PMIC).

The battery 189 may supply power to at least one component of the electronic device 101. The battery 189 may include, for example, a primary cell, which is not rechargeable, a secondary cell, which is rechargeable, or a fuel cell.

The communication module 190 may support establishing a direct (e.g., wired) communication channel or a wireless communication channel between the electronic device 101 and an external electronic device (e.g., the external electronic device 102, the external electronic device 104, or the server 108) and performing communication via the established communication channel. The communication module 190 may include one or more CPs that are operable independently from the processor 120 (e.g., an AP) and that support direct (e.g., wired) communication or wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device, for example, the external electronic device 104, via the first network 198 (e.g., a short-range communication network, such as Bluetooth™ wireless-fidelity (Wi-Fi) direct, or infrared data association (IrDA)) or the second network 199 (e.g., a long-range communication network, such as a legacy cellular network, a 5th generation (5G) network, a next-generation communication network, the Internet, or a computer network (e.g., an LAN or a wide area network (WAN)). These various types of communication modules may be implemented as a single component (e.g., a single chip), or may be implemented as multiple components (e.g., multiple chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4th generation (4G) network, and a next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a millimeter wave (mmWave) band) to achieve, e.g., a high data transmission rate. The wireless communication module 192 may support various technologies for securing performance on a high-frequency band, such as, e.g., beamforming, massive multiple-input and multiple-output (MIMO), full dimensional MIMO (FD-MIMO), an array antenna, analog beamforming, or a large-scale antenna. The wireless communication module 192 may support various requirements specified in the electronic device 101, an external electronic device (e.g., the external electronic device 104), or a network system (e.g., the second network 199). The wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., an external electronic device) of the electronic device 101. The antenna module 197 may include an antenna including a radiating element including a conductive material or a conductive pattern formed in or on a substrate (e.g., a printed circuit board (PCB)). The antenna module 197 may include a plurality of antennas (e.g., an antenna array). In such a case, at least one antenna appropriate for a communication scheme used in a communication network, such as the first network 198 or the second network 199, may be selected by, for example, the communication module 190 from the plurality of antennas. The signal or power may be transmitted or received between the communication module 190 and the external electronic device via the at least one selected antenna. According to an embodiment of the disclosure, another component (e.g., a radio frequency integrated circuit (RFIC)) other than the radiating element may be additionally formed as a part of the antenna module 197.

The antenna module 197 may form an mmWave antenna module. The mmWave antenna module may include a PCB, an RFIC on a first surface (e.g., a bottom surface) of the PCB or adjacent to the first surface of the PCB and capable of supporting a designated high-frequency band (e.g., a mmWave band), and a plurality of antennas (e.g., an antenna array) disposed on a second surface (e.g., a top or a side surface) of the PCB, or adjacent to the second surface of the PCB and capable of transmitting or receiving signals in the designated high-frequency band.

At least some of the components described above may be coupled mutually and exchange signals (e.g., commands or data) therebetween via an inter-peripheral communication scheme (e.g., a bus, general-purpose input and output (GPIO), serial peripheral interface (SPI), or mobile industry processor interface (MIPI)).

According to an embodiment of the disclosure, commands or data may be transmitted or received between the electronic device 101 and the external electronic device (e.g., the external electronic device 104) via the server 108 coupled with the second network 199. Each of the external electronic devices (e.g., the external electronic device 102 or 104) may be a device of the same type as or a different type from the electronic device 101. All or some of operations to be executed by the electronic device 101 may be executed by one or more of the external electronic devices (e.g., the external electronic devices 102 and 104 and the server 108). For example, if the electronic device 101 needs to perform a function or a service automatically, or in response to a request from a user or another device, the electronic device 101, instead of, or in addition to, executing the function or service, may request one or more external electronic devices to perform at least a part of the function or service. The one or more external electronic devices receiving the request may perform the at least part of the function or the service requested, or an additional function or an additional service related to the request and may transfer a result of the performance to the electronic device 101. The electronic device 101 may provide the result, with or without further processing of the result, as at least part of a response to the request. To that end, cloud computing, distributed computing, mobile edge computing (MEC), or client-server computing technology may be used, for example. The electronic device 101 may provide ultra-low latency services using, e.g., distributed computing or MEC. According to an embodiment of the disclosure, the external electronic device (e.g., the external electronic device 104) may include an Internet-of-things (IOT) device. The server 108 may be an intelligent server using machine learning and/or a neural network. The external electronic device (e.g., the external electronic device 104) or the server 108 may be included in the second network 199. The electronic device 101 may be applied to intelligent services (e.g., a smart home, a smart city, a smart car, or healthcare) based on 5G communication technology or IoT-related technology.

According to various embodiments described herein, an electronic device may be a device of one of various types. The electronic device may include, as non-limiting examples, a portable communication device (e.g., a smartphone, or the like), a computing device, a portable multimedia device, a portable medical device, a camera, a wearable device, or consumer electronics. However, the electronic device is not limited to the examples described above.

Figure 2A:
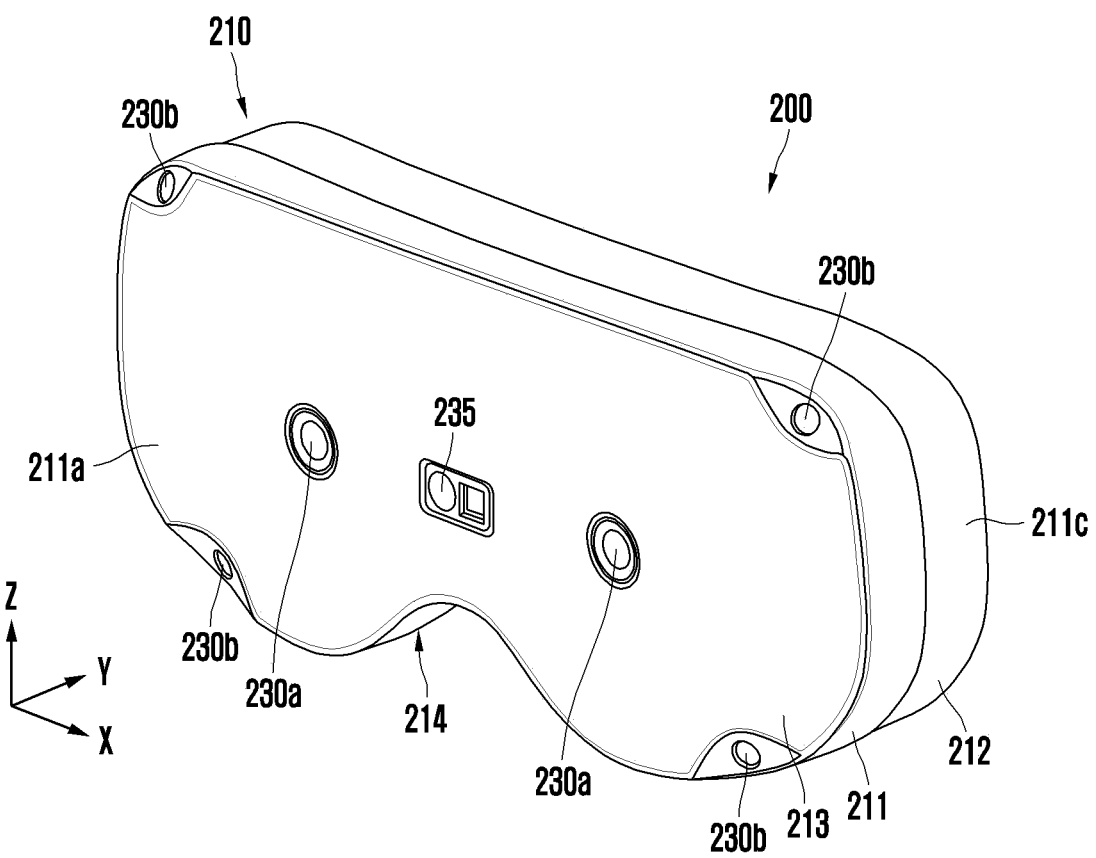
FIG. 2A is a front perspective view of a wearable device according to an embodiment of the disclosure.
Figure 2B:
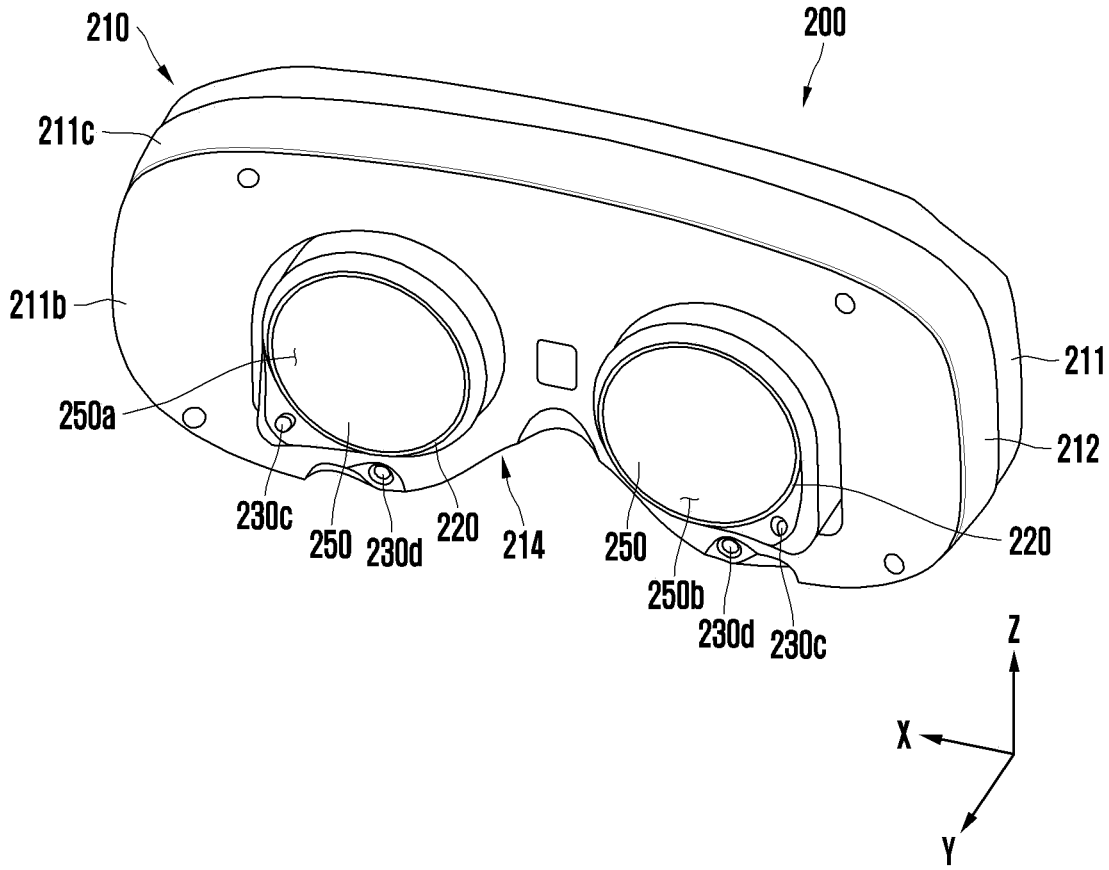
FIG. 2B is a rear perspective view of a wearable device according to an embodiment of the disclosure.

FIG. 2A is a front perspective view of a wearable device according to an embodiment of the disclosure. FIG. 2B is a rear perspective view of a wearable device according to an embodiment of the disclosure.

Referring to FIGS. 2A and 2B, a wearable device 200 (e.g., the electronic device 101 of FIG. 1) may be worn on a portion of a body of a user to provide a user interface (UI).

In an embodiment of the disclosure, the wearable device 200 may output images and/or videos to the user. Alternatively, the wearable device 200 may provide images associated with an augmented reality (AR) service and/or a virtual reality (VR) service. For example, the wearable device 200 may provide the user with AR, VR, mixed reality (MR), and/or extended reality (XR) experiences.

For example, the wearable device 200 may provide AR to the user. The wearable device 200 may transfer a virtual object image output from a display module 250 (e.g., the display module 160 of FIG. 1) to the eyes of the user, and the virtual object image may use data on images of the real world captured through a plurality of cameras 230*a*, 230*b*, 230*c*, and 230*d*.

In an embodiment of the disclosure, the wearable device 200 may be, for example, a head-mounted display (HMD), a face-mounted display (FMD), or smart glasses or a headset that provides XR, such as AR, VR, and MR, but examples of which are not limited thereto.

In an embodiment of the disclosure, the wearable device 200 may include at least some of the following: a housing 210, the plurality of cameras 230*a*, 230*b*, 230*c*, and 230*d*, and the display module 250. However, FIGS. 2A and 2B show an example outer shape of the wearable device 200 according to an embodiment of the disclosure, and actual implementations thereof are not limited thereto.

In an embodiment of the disclosure, the wearable device 200 may include the housing 210. The housing 210 may be configured to house at least one component. The housing 210 may include a first surface 211*a* (e.g., a front surface), a second surface 211*b* (e.g., a rear or wearable surface) opposite the first surface 211*a*, and a third surface 211*c* (e.g., a side surface) between the first surface 211*a* and the second surface 211*b*.

In an embodiment of the disclosure, the housing 210 may include a plurality of housing parts. For example, the housing 210 may include a first housing part 211 and a second housing part 212. The first housing part 211 may form the first surface 211*a* of the housing 210. The first housing part 211 may form at least a portion of the third surface 211*c* of the housing 210. The second housing part 212 may form the second surface 211*b* of the housing 210. The second housing part 212 may form at least a portion of the third surface 211*c* of the housing 210. In an embodiment of the disclosure, the second housing part 212 may face a portion (e.g., face) of the body of the user. In an embodiment of the disclosure, the first housing part 211 and the second housing part 212 may be detachably coupled. In an embodiment of the disclosure, the first housing part 211 and the second housing part 212 may be integrally and seamlessly connected.

In an embodiment of the disclosure, the housing 210 may include a cover 213. The cover 213 may form the first surface 211*a* of the housing 210. The cover 213 may be configured to cover at least a portion of the first housing part 211.

In an embodiment of the disclosure, the housing 210 may include a bridge 214. The bridge 214 may be configured to face a portion (e.g., nose) of the body of the user. For example, the bridge 214 may be supported by the nose of the user. The bridge 214 may be formed by at least one of the first housing part 211, the second housing part 212, or the cover 213, or a combination thereof.

In an embodiment of the disclosure, the wearable device 200 may include a lens structure 220. The lens structure 220 may include a plurality of lenses configured to adjust the focus of images to be provided to the user. For example, the plurality of lenses may be configured to adjust the focus of images output by the display module 250. The plurality of lenses may be disposed at positions corresponding to a position of the display module 250. The plurality of lenses may include, for example, a Fresnel lens, a pancake lens, a multichannel lens, and/or any other suitable lens.

In an embodiment of the disclosure, the wearable device 200 may include the display module 250 (e.g., the display module 160 of FIG. 1). The display module 250 may be configured to provide images (e.g., virtual images) to the user. The display module 250 may include, for example, a liquid-crystal display (LCD), a digital micromirror device (DMD), a liquid crystal on silicon (LCoS), an organic light-emitting diode (OLED), and/or a micro-light-emitting diode (micro-LED). In some embodiments of the disclosure, the display module 250 may include a light source (not shown) configured to transmit an optical signal to an area to which an image is to be output. In some embodiments of the disclosure, the display module 250 may provide images to the user by generating optical signals itself.

In an embodiment of the disclosure, the display module 250 may be disposed on the second surface 211*b* of the housing 210. For example, the display module 250 may be positioned such that one side of a pair of lenses (e.g., a lens 263 of FIG. 3) of the display module 250 is exposed to the outside through the second surface 211*b*.

In an embodiment of the disclosure, the display module 250 may include, for example, an LCD, a DMD, an LCOS, an OLED, an OLED on silicon (OLEDoS), or a micro-LED.

The display module 250, according to an embodiment of the disclosure, may include OLEDs. For example, the OLEDs may represent colors, such as red (R), green (G), and blue (B) through the self-emission of organic matter. However, examples are not limited thereto, and a single pixel may include R, G, and B, and a single chip may be implemented with a plurality of pixels each including R, G, and B.

In an embodiment of the disclosure, the display module 250 may display various images. An image used herein may be construed as a concept including a still image and a moving image (or video), and display module 250 may display various types of images, such as broadcast content, multimedia content, and the like. The display module 250 may also display UIs and icons.

In an embodiment of the disclosure, the display module 250 may include a separate integrated circuit (IC) chip, and the IC chip may display an image based on an image signal received from a processor (e.g., the processor 120 of FIG. 1). In an embodiment of the disclosure, the IC chip may display an image by generating a drive signal of a plurality of light-emitting devices based on an image signal received from the processor 120 and controlling the light emission of a plurality of pixels included in a display panel based on the drive signal.

In an embodiment of the disclosure, the display module 250 may be disposed in the second housing part 212. In an embodiment of the disclosure, the display module 250 may include a first display area 250*a* and a second display area 250*b*. For example, the first display area 250*a* may be disposed to face a left eye of the user, and the second display area 250*b* may be disposed to face a right eye of the user.

In an embodiment of the disclosure, the first display area 250*a* and the second display area 250*b* may include glass, plastic, and/or polymer. In an embodiment of the disclosure, the first display area 250*a* and the second display area 250*b* may include a transparent material or a translucent material.

In an embodiment of the disclosure, the first display area 250*a* and the second display area 250*b* may form a single display area. In an embodiment of the disclosure, the first display area 250*a* and the second display area 250*b* may form a plurality of display areas.

In an embodiment of the disclosure, the display module 250 may include a plurality of pixels for displaying a virtual image. In an embodiment of the disclosure, the display module 250 may further include infrared pixels that emit infrared light.

In an embodiment of the disclosure, the display module 250 may further include a light-receiving pixel (e.g., a photo sensor pixel) disposed between the pixels and configured to receive light reflected from the eyes of the user, convert the light into electrical energy, and output the electrical energy. The light-receiving pixel may also be referred to herein as an "eye-tracking sensor." The eye-tracking sensor may detect infrared light that is reflected by the eyes of the user after emitted by the infrared pixels included in the display module 250.

In an embodiment of the disclosure, the wearable device 200 may use the light-receiving pixel to detect a gaze direction (e.g., pupil movement) of the user. For example, the wearable device 200 may detect and track a gaze direction relative to the left eye of the user and a gaze direction relative to the right eye of the user through one or more light-receiving pixels that form the first display area 250*a* and one or more light-receiving pixels that form the second display area 250*b*.

In an embodiment of the disclosure, the wearable device 200 may determine a position of the center of a virtual image based on the gaze direction of the left eye of the user and the gaze direction of the right eye of the user (i.e., the directions in which the pupils of the left eye and the right eye of the user are gazing) detected through the one or more light-receiving pixels.

In an embodiment of the disclosure, the wearable device 200 may include a sensor 235 (e.g., the sensor module 176 of FIG. 1). The sensor 235 may be configured to detect a depth of a subject to be detected or captured. The sensor 235 may be configured to transmit a transmitting signal toward the subject and/or receive a receiving signal from the subject. The transmitting signal may include, for example, near-infrared light, ultrasound, and/or laser. The sensor 235 may be configured to measure a time of flight (ToF) of a signal to measure a distance between the wearable device 200 and the subject. In an embodiment of the disclosure, the sensor 235 may be disposed on the first surface 211*a* of the housing 210. In an embodiment of the disclosure, the sensor 235 may be disposed at the center of the first housing part 211 and/or the cover 213.

In an embodiment of the disclosure, the plurality of cameras 230*a*, 230*b*, 230*c*, and 230*d* (e.g., the camera module 180 of FIG. 1) may include at least some of a plurality of front cameras 230*a* and 230*b*, an eye-tracking camera 230*c*, and a facial recognition camera 230*d*. The plurality of cameras 230*a*, 230*b*, 230*c*, and 230*d* may capture images of the outside of the housing 210, such as, for example, the user and/or other subjects. For example, the plurality of cameras 230a, 230b, 230c, and 230d may convert optical signals into input data and provide the input data to the processor (e.g., the processor 120 of FIG. 1).

In an embodiment of the disclosure, the processor 120 may receive the provided input data and transmit output data to the display module 250 or to the display panel (e.g., a display panel 261 of FIG. 3) of the display module 250. In an embodiment of the disclosure, the processor 120 may combine respective input data received from of the plurality of cameras 230a, 230b, 230c, and 230d, and process the combined data to control the display module 250.

In an embodiment of the disclosure, the plurality of front cameras 230a and 230b may be spaced apart from each other on the first surface 211a of the housing 210 to capture an image in a direction in which the first surface 211a of the housing 210 faces. They may include at least one first camera 230a and at least one second camera 230b. In an embodiment of the disclosure, the plurality of front cameras 230a and 230b may be spaced apart from each other on the first surface 211a of the housing 210. The plurality of front cameras 230a and 230b may be disposed to face different directions from each other, such as, the first surface 211a or the third surface 211c, to capture images in different directions.

In an embodiment of the disclosure, the first camera 230a may be configured to obtain an image from a subject to be captured. The first camera 230a may be provided as a plurality of first cameras 230a, of which one first camera 230a may be disposed on a first portion (e.g., a −X direction portion in FIG. 2A) of the first surface 211a of the housing 210 and another first camera 230a may be disposed on a portion (e.g., a +X direction portion in FIG. 2A) of the first surface 211a of the housing 210 that is different from the first portion. The plurality of first cameras 230a may be disposed on both sides of the sensor 235. The plurality of first cameras 230a may include an image stabilizer actuator (not shown) and/or an autofocus actuator (not shown). For example, the plurality of first cameras 230a may include at least one of a camera configured to obtain color images, a global shutter (GS) camera, or a rolling shutter (RS) camera, or a combination thereof.

In an embodiment of the disclosure, the second camera 230b may be configured to recognize a subject. The second camera 230b may be provided as a plurality of second cameras 230b, and the plurality of second cameras 230b may be configured to detect and/or track an object (e.g., a human head or hand) or space in three or six degrees of freedom (DoF). For example, the plurality of second cameras 230b may include a GS camera. The plurality of second cameras 230b may be configured to perform simultaneous localization and mapping (SLAM) using depth information of the subject. The plurality of second cameras 230b may be configured to recognize gestures of the subject. In an embodiment of the disclosure, the plurality of second cameras 230b may be disposed on the first surface 211a of the housing 210. In an embodiment of the disclosure, the plurality of second cameras 230b may be respectively disposed at corner areas of the first housing part 211 and/or the cover 213.

In an embodiment of the disclosure, the plurality of front cameras 230a and 230b may be image-capturing cameras, which may also be referred to as high resolution (HR) or photo video (PV), and may include cameras with high resolution. The plurality of front cameras 230a and 230b may include a color camera with functions for obtaining high-quality images, such as, for example, an autofocus (AF) function and an optical image stabilizer (OIS). However, examples are not limited thereto, and the plurality of front cameras 230a and 230b may include a GS camera or an RS camera.

In an embodiment of the disclosure, the eye-tracking camera 230c may be disposed on the second surface 211b of the housing 210. The eye-tracking camera 230c may detect a movement of an object that views the display panel 261 of the display module 250, and may be configured to detect and track, for example, the pupils of the eyes of the user. The eye-tracking camera 230c may be provided as a plurality of eye-tracking cameras 230c. In this case, position information about the pupils of the eyes of the user may be used such that the center of an image displayed on the display module 250 shifts according to a direction in which the pupils of the user gaze.

For example, the plurality of eye-tracking cameras 230c may include a GS camera. Of the plurality of eye-tracking cameras 230c, one eye-tracking camera 230c may be disposed relative to the left eye of the user and another eye-tracking camera 230c may be disposed relative to the right eye of the user.

In an embodiment of the disclosure, the wearable device 200 may include a plurality of fourth cameras 230d (e.g., the camera module 180 of FIG. 1). The plurality of fourth cameras 230d may be configured to recognize the face of the user. For example, the plurality of fourth cameras 230d may be configured to detect and track facial expressions of the user.

In an embodiment of the disclosure, at least one of the plurality of cameras 230a, 230b, 230c, and 230d may include a camera used for 3DoF and 6DoF head tracking, hand detection and tracking, and gesture and/or spatial recognition.

In an embodiment of the disclosure, at least one of the plurality of cameras 230a, 230b, 230c, and 230d may include a GS camera to detect head and hand movements and track movements. For example, a stereo camera may be used for head tracking and spatial recognition, and thus two GS cameras of the same specifications and performance may be used, and an RS camera may be used to detect and track fine movements, such as, fast hand and finger movements.

In an embodiment of the disclosure, at least one of the plurality of cameras 230a, 230b, 230c, and 230d may be primarily, but not necessarily, a GS camera with better performance per camera (e.g., image drag), but an RS camera may also be used. At least one of the plurality of cameras 230a, 230b, 230c, and 230d may also perform a SLAM function by 6DoF spatial recognition and depth imaging. Alternatively, in an embodiment of the disclosure, at least one of the plurality of cameras 230a, 230b, 230c, and 230d may perform user gesture recognition.

In an embodiment of the disclosure, although not shown, the wearable device 200 may include at least some of the following: a sensor (not shown), a lighting unit (not shown), a plurality of microphones (not shown), a plurality of speakers (not shown), a battery (not shown), and a printed circuit board (PCB) (not shown).

In an embodiment of the disclosure, the sensor (not shown) may be provided as one or more sensors (e.g., a gyro sensor, an acceleration sensor, a geomagnetic sensor, and/or a gesture sensor) for various purposes, and may perform at least one of, for example, 6DoF head tracking, pose estimation and prediction, gesture and/or spatial recognition, and/or depth imaging-based SLAM.

In an embodiment of the disclosure, the lighting unit (not shown) may be used for various purposes depending on a position to which it is attached. For example, the lighting unit (not shown) may be attached around the second surface 211*b* of the wearable device 200. The lighting unit (not shown) may be used as an aid to facilitate eye gaze detection when the eye-tracking camera 230*c* captures the pupils. The lighting unit (not shown) may use an infrared light-emitting device (IR LED) of a visible light wavelength or an infrared light wavelength.

For example, the lighting unit (not shown) may be attached to or around the front surface 211*a* of the wearable device 200. The lighting unit (not shown) may be used as a means of supplementing ambient brightness when the plurality of front cameras 230*a* and 230*b* capture images. The lighting unit (not shown) may be used particularly in dark environments or when it is difficult to detect a subject to be captured due to mixed and reflected light from multiple light sources.

In various embodiments of the disclosure, the lighting unit (not shown) may be omitted. The lighting unit (not shown) may be replaced by infrared pixels included in the first display area 250*a* and the second display area 250*b*. In an embodiment of the disclosure, the lighting unit (not shown) may be included in the wearable device 200 to supplement the infrared pixels included in the first display area 250*a* and the second display area 250*b*.

In an embodiment of the disclosure, the plurality of microphones (not shown) may process external acoustic signals into electrical voice data. The obtained voice data may be used in various ways depending on a function (or an application being executed) being performed by the wearable device 200.

In an embodiment of the disclosure, the plurality of speakers (not shown) may output audio data received from a communication circuit (e.g., the communication module 190 of FIG. 1) or stored in memory (e.g., the memory 130 of FIG. 1).

In an embodiment of the disclosure, the battery (not shown) may be included as one or more batteries in the wearable device 200 and may supply power to the components included in the wearable device 200.

In an embodiment of the disclosure, the PCB (not shown) may transfer electrical signals to each module (e.g., camera, display, audio, or sensor) and other PCBs through a flexible PCB (FPCB).

In an embodiment of the disclosure, on the PCB (not shown), a control circuitry (not shown) configured to control the components included in the wearable device 200, excluding the first display area 250*a* and the second display area 250*b*, may be disposed. The control circuitry (not shown) may control the components other than the first display area 250*a* and the second display area 250*b* and perform computation (or operations). The control circuitry (not shown) may include a communication circuit (e.g., the communication module 190 of FIG. 1) or memory (e.g., the memory 130 of FIG. 1). However, examples are not limited thereto, and in an embodiment of the disclosure, the control circuitry (not shown) may control the first display area 250*a*, the second display area 250*b*, and/or other components.

Figure 3:
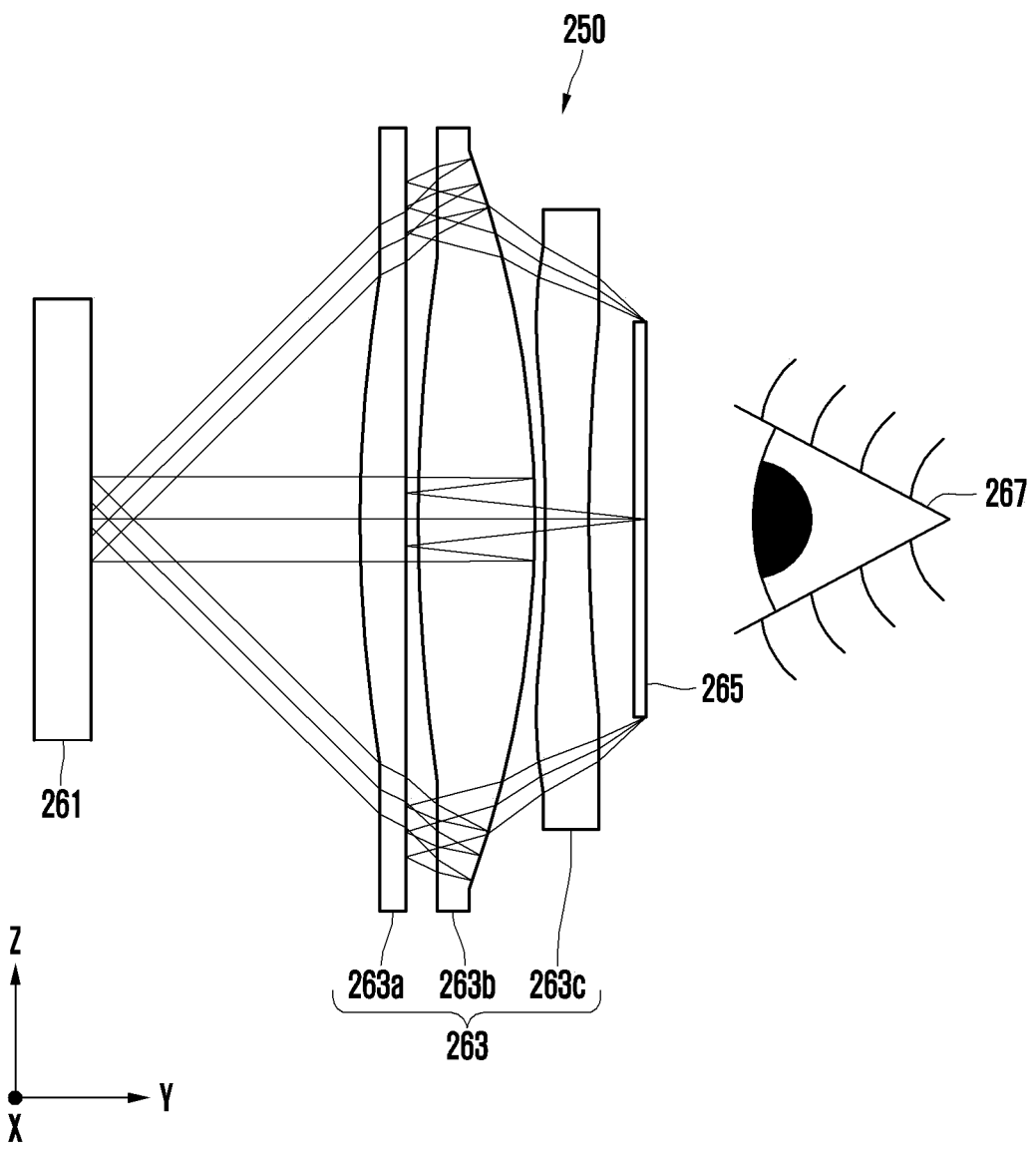
FIG. 3 is a diagram illustrating a structure of a display module according to an embodiment of the disclosure.

FIG. 3 is a diagram illustrating a structure of a display module according to an embodiment of the disclosure.

Referring to FIG. 3 according to an embodiment of the disclosure, the display module 250 may include a display panel 261, a lens 263, and a screen 265.

In an embodiment of the disclosure, light emitted from the display panel 261 may pass through the lens 263 and the screen 265 to face an eye 267 of a user. In an embodiment of the disclosure, the display panel 261 may emit light relative to one direction (e.g., +Y direction) toward the eye 267 of the user, and the light emitted from the display panel 261 may be diffused and travel in a plurality of directions. The diffused light may be refracted while passing through the lens 263 to be directed to the screen 265.

In an embodiment of the disclosure, the lens 263 may be disposed on a front surface of the display module 250. The lens 263 may have a triplex structure including a plurality of sub-lenses 263*a*, 263*b*, and 263*c*. The lens 263 may be implemented as a pancake lens (or "folded optics") structure, for example.

In an embodiment of the disclosure, the lens 263 implemented as a pancake lens may be effective in overall thinning of a device. For example, in a case where downsizing, lightweighting, or thinning is required for a device, such as, the wearable device 200 or a portable display device (not shown), the pancake lens may be adopted as the lens 263.

In an embodiment of the disclosure, the plurality of sub-lenses 263*a*, 263*b*, and 263*c* may include a concave lens and/or a convex lens. For example, the plurality of sub-lenses 263*a*, 263*b*, and 263*c* may include a projection lens or a collimation lens. In an embodiment of the disclosure, the light emitted from the display module 250 may be guided along an optical path directed toward the eye 267 of the user through the plurality of sub-lenses 263*a*, 263*b*, and 263*c*.

In an embodiment of the disclosure, the screen 265 may be formed of glass, plastic, or polymer to be transparent or translucent. The screen 265 may include a grating structure of, for example, a polygonal or curved shape, with a nanopattern formed on an inner or outer surface thereof.

In an embodiment of the disclosure, the screen 265 may include at least one of at least one diffractive element (DOE), holographic optical element (HOE), or reflective element (e.g., reflective mirror). Using the at least one DOE or reflective element included in the screen 265, the screen 265 may guide the light emitted from the display panel 261 to the eye 267 of the user.

In an embodiment of the disclosure, the lens 263 and the screen 265 may be provided in plural to face a left eye and a right eye of the user, respectively.

In an embodiment of the disclosure, the light emitted from the display panel 261 may be diffracted in different ranges depending on a viewing angle of the display panel 261. For example, a portion of the light emitted from the display panel 261 may pass through an edge area of the lens 263. While passing through the edge area of lens 263, the light may be refracted at different refractive indices depending on a wavelength. In this case, light that has passed through the lens 263 to be directed to an edge area of the screen 265 may form a color band that is relatively reddish compared to a center area. Such a color banding phenomenon of the display panel 261 will be described later with reference to FIGS. 4A to 4E.

Figure 4A:
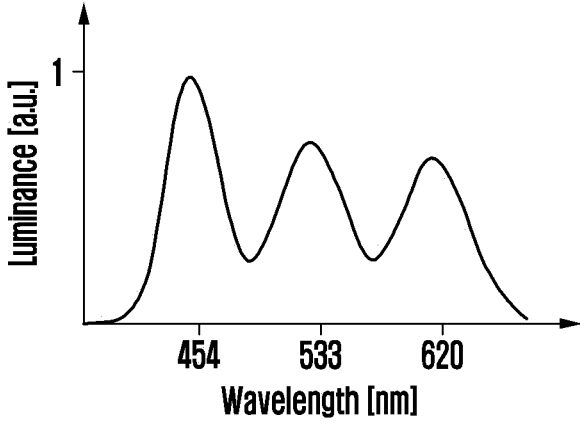
FIG. 4A is a graph profiling a red, green, blue (RGB) wavelength spectrum of a display panel according to an embodiment of the disclosure.
Figure 4B:
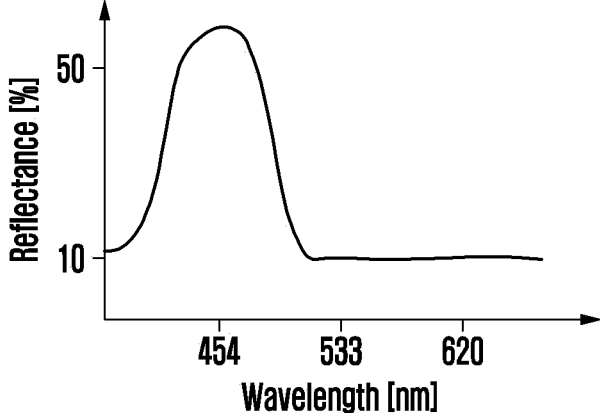
FIG. 4B is a graph profiling a transmittance of a cholesteric liquid crystal (CLC) with respect to a light source in a blue wavelength band of a display panel according to an embodiment of the disclosure.
Figure 4C:
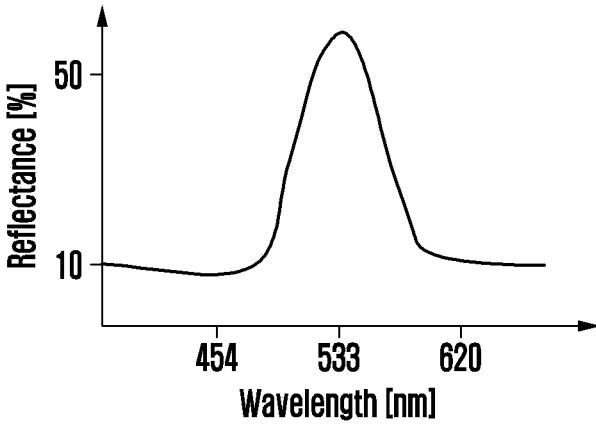
FIG. 4C is a graph profiling a transmittance of a CLC layer with respect to a light source in a green wavelength band of a display panel according to an embodiment of the disclosure.
Figure 4D:
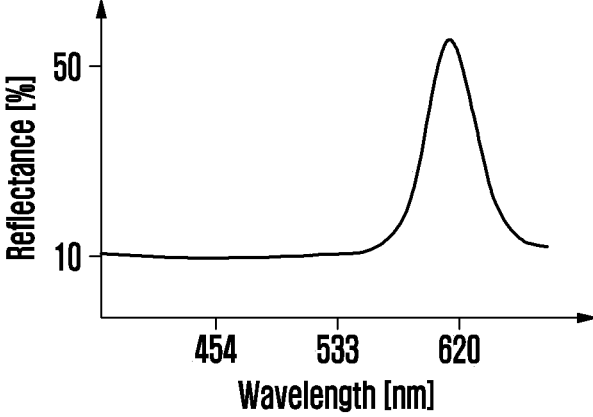
FIG. 4D is a graph profiling a transmittance of a CLC layer with respect to a light source in a red wavelength band of a display panel according to an embodiment of the disclosure.
Figure 4E:
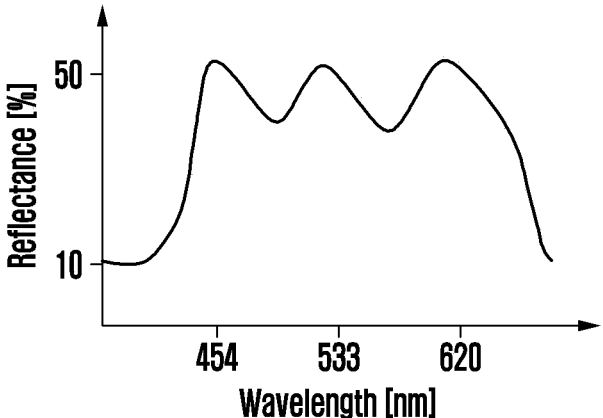
FIG. 4E is a graph profiling a transmittance of a CLC film of a display panel according to an embodiment of the disclosure.

FIG. 4A is a graph profiling an RGB wavelength spectrum of a display panel according to an embodiment of the disclosure. FIGS. 4B, 4C, and 4D are graphs profiling a transmittance of a cholesteric liquid crystal (CLC) with respect to a light source in a blue (B) wavelength band of a display panel, a light source in a green (G) wavelength band of the display panel, and a light source in a red (R) wavelength band of the display panel, respectively according to various embodiments of the disclosure. FIG. 4E is a graph profiling a transmittance of a CLC film of a display panel according to an embodiment of the disclosure.

For example, the B wavelength band may be a wavelength band of a blue light source (e.g., a wavelength band of about 450 to 460 nm), the G wavelength band may be a wavelength band of a green light source (e.g., a wavelength band of about 530 to 540 nm), and the R wavelength band may be a wavelength band of a red light source (e.g., a wavelength band of about 615 to 625 nm). Although the wavelength band is limited to the preceding examples for ease of explanation, it is not limited thereto in actual implementations but may be set based on various ranges.

Referring to FIG. 4A, the CLC film may have different wavelengths that are converted into circularly polarized light depending on the pitch of a CLC layer. Based on this, to convert a full color, for example, the R, G, and B wavelength bands, into circularly polarized light, the CLC film including three single CLC layers respectively corresponding to the R, G, and B wavelength bands may be required.

Referring to FIGS. 4B, 4C, and 4D, the CLC layer for the light source in the B wavelength band, the CLC layer for the light source in the G wavelength band, and the CLC layer for the light source in the R wavelength band may provide relatively high transmittance (e.g., 50% or greater) in the respectively targeted wavelength bands, and may provide relatively low transmittance (e.g., approximately 10%) for a light source in wavelength bands outside of a certain range.

Referring to FIG. 4E, the transmittance of the CLC film including at least three CLC layers, which is formed by stacking the CLC layer for the light source in the B wavelength, the CLC layer for the light source in the G wavelength band, and the CLC layer for the light source in the R wavelength band, respectively shown in FIGS. 4B to 4D, is predicted.

In an embodiment of the disclosure, matching a wavelength range of a point with a maximum transmittance shown in FIG. 4E to a range of the RGB wavelength spectrum of the display panel shown in FIG. 4A may increase the efficiency of circular polarization conversion of the CLC film.

In an embodiment of the disclosure, compared to a display panel including a quarter-wave plate (QWP) and a polarization (POL) film, the display panel including the CLC film may have the advantage of being capable of converting non-polarized light into circularly polarized light relatively simply. However, the display panel including the CLC film may change a wavelength of light output through the CLC film depending on an angle of light incident on the CLC film.

In an embodiment of the disclosure, when the display panel is viewed by the user through a lens implemented as a pancake lens, the display panel including the CLC film may cause color banding, which is a phenomenon in which a white balance of an outer portion of a white screen is distorted by the wavelength change described above.

According to an embodiment of the disclosure, a display panel (e.g., the display panel 261 of FIG. 3) may include a CLC film to maintain or enhance the advantages described above and may reduce or prevent color banding through structural characteristics of the display panel 261. Hereinafter, a wearable device including a display panel including a CLC film, which may prevent color banding described above and provide clear image quality and/or color reproduction, will be described.

Figure 5:
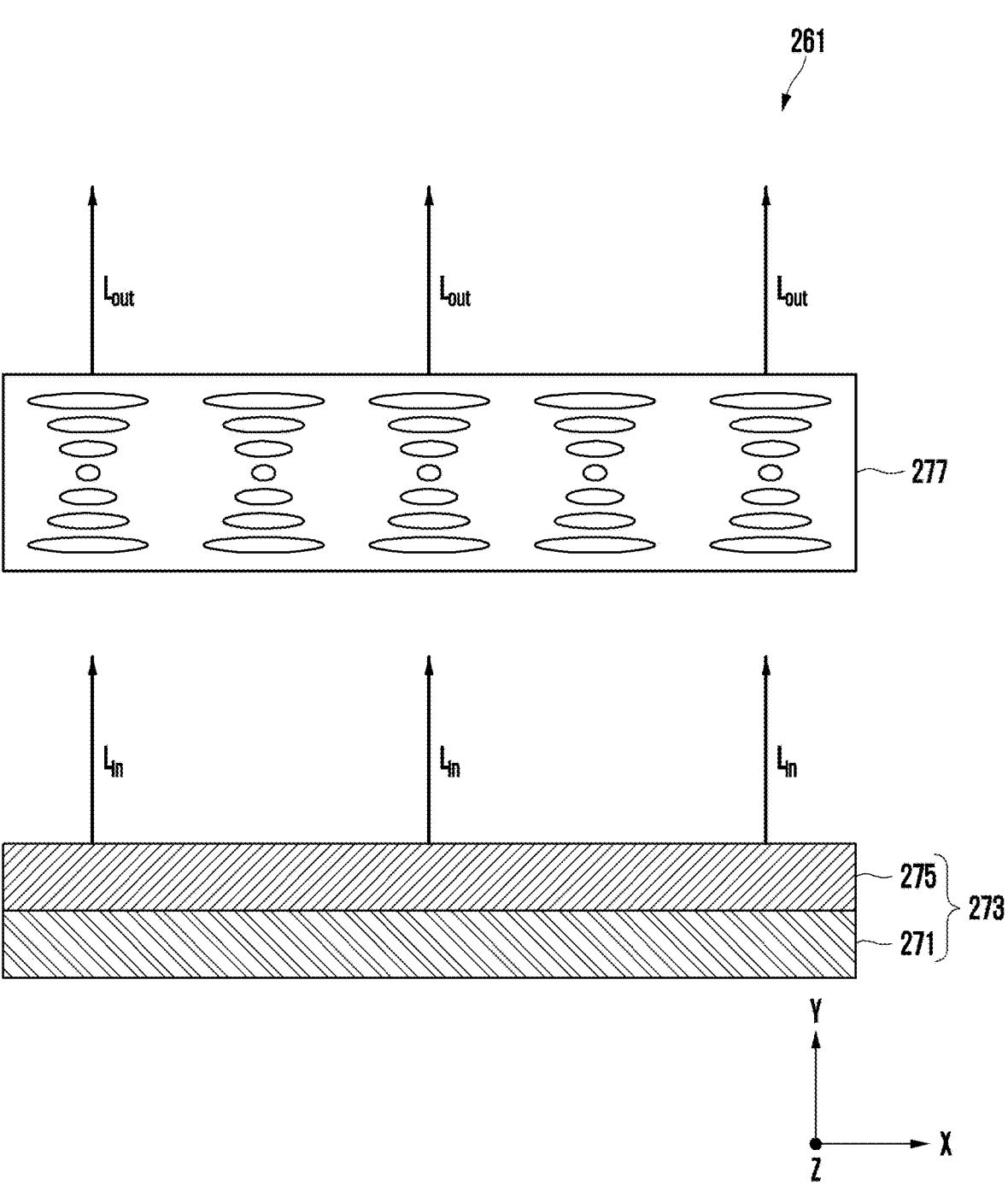
FIG. 5 is a diagram illustrating a structure of a display panel according to an embodiment of the disclosure.

FIG. 5 is a diagram illustrating a structure of a display panel according to an embodiment of the disclosure.

Referring to FIG. 5, according to an embodiment of the disclosure, the display panel 261 may include a substrate 273 and a CLC film 277.

In an embodiment of the disclosure, the display panel 261 may output circularly polarized light. For example, when light output from the display panel 261 passes through a pancake lens (e.g., the lens 263 of FIG. 3), the display panel 261 may output the circularly polarized light. To output the circularly polarized light, the display panel 261 may include the CLC film 277.

In an embodiment of the disclosure, a plurality of light-emitting devices (e.g., a plurality of light-emitting devices 269 of FIG. 7) may be disposed on the substrate 273. The substrate 273 may output light through the plurality of light-emitting devices 269. The output light may pass through the CLC film 277 disposed in one direction (e.g., +Y direction) of the substrate 273. For example, the light output from the substrate 273 may be incident light $L_{in}$, and the light that has passed through the CLC film 277 may be output light $L_{out}$.

In an embodiment of the disclosure, the substrate 273 of the display panel 261 may include a rear substrate 271 and a front substrate 275. The rear substrate 271 may be formed of a silicon wafer, such as, for example, silicon oxide (SiOx), silicon nitride (SiNx), or a multi-layer thereof. The rear substrate 271 may have a thin-film transistor (e.g., a thin-film transistor 283 of FIG. 9) that is protected by the rear substrate 271.

In an embodiment of the disclosure, the front substrate 275 may be disposed on the rear substrate 271. On the front substrate 275, a pixel define layer (PDL) bank (e.g., a PDL bank 290 of FIG. 7), some of the plurality of light-emitting devices 269, and a component for driving the plurality of light-emitting devices 269 may be disposed.

In an embodiment of the disclosure, the CLC film 277 may be disposed on the substrate 273, and may circularly polarize the light output from the plurality of light-emitting devices 269. For example, the CLC film 277 may circularly polarize the incident light $L_{in}$ in a non-polarized light state and output the circularly polarized light. The output light $L_{out}$ that has passed through the CLC film 277 may be right-circularly polarized (RCP) or left-circularly polarized (LCP) light. Based on an output direction (e.g., +Y direction) of the output light $L_{out}$, light in a state circularly polarized counterclockwise may be the LCP light, and light in a state circularly polarized clockwise may be the RCP light.

In an embodiment of the disclosure, the incident light $L_{in}$ may change in wavelength while passing through the CLC film 277 depending on an incidence angle. For example, in a case where the incident light $L_{in}$ is light having a first wavelength, the output light $L_{out}$ may change to a second wavelength through the CLC film 277. The second wavelength may change from the first wavelength based on a sine value $(\sin \theta)$ of an angle $(\theta)$ at which the incident light $L_{in}$ is emitted.

In an embodiment of the disclosure, by controlling the output angle of the incident light $L_{in}$, the display panel 261 may reduce or prevent a color change of the output light $L_{out}$, and the display panel 261 may provide clear and clean images or videos.

For example, in a case where the angle $\theta$ at which the incident light $L_{in}$ is output is substantially perpendicular to the substrate 273 (e.g., $\theta=90°$) or close thereto, the sine value $\sin \theta$ described above may become "1," which may reduce or prevent the color change of the output light $L_{out}$, thereby reducing or preventing a color banding phenomenon.

In an embodiment of the disclosure, the display panel 261 may limit an angle at which the incident light $L_{in}$ is emitted by limiting a viewing angle of the light output by the plurality of light-emitting devices 269. For example, the display panel 261 may limit an inclination angle of the PDL bank 290 to control the viewing angle of the plurality of light-emitting devices 269, which will be described below with reference to FIG. 7.

Figure 6:
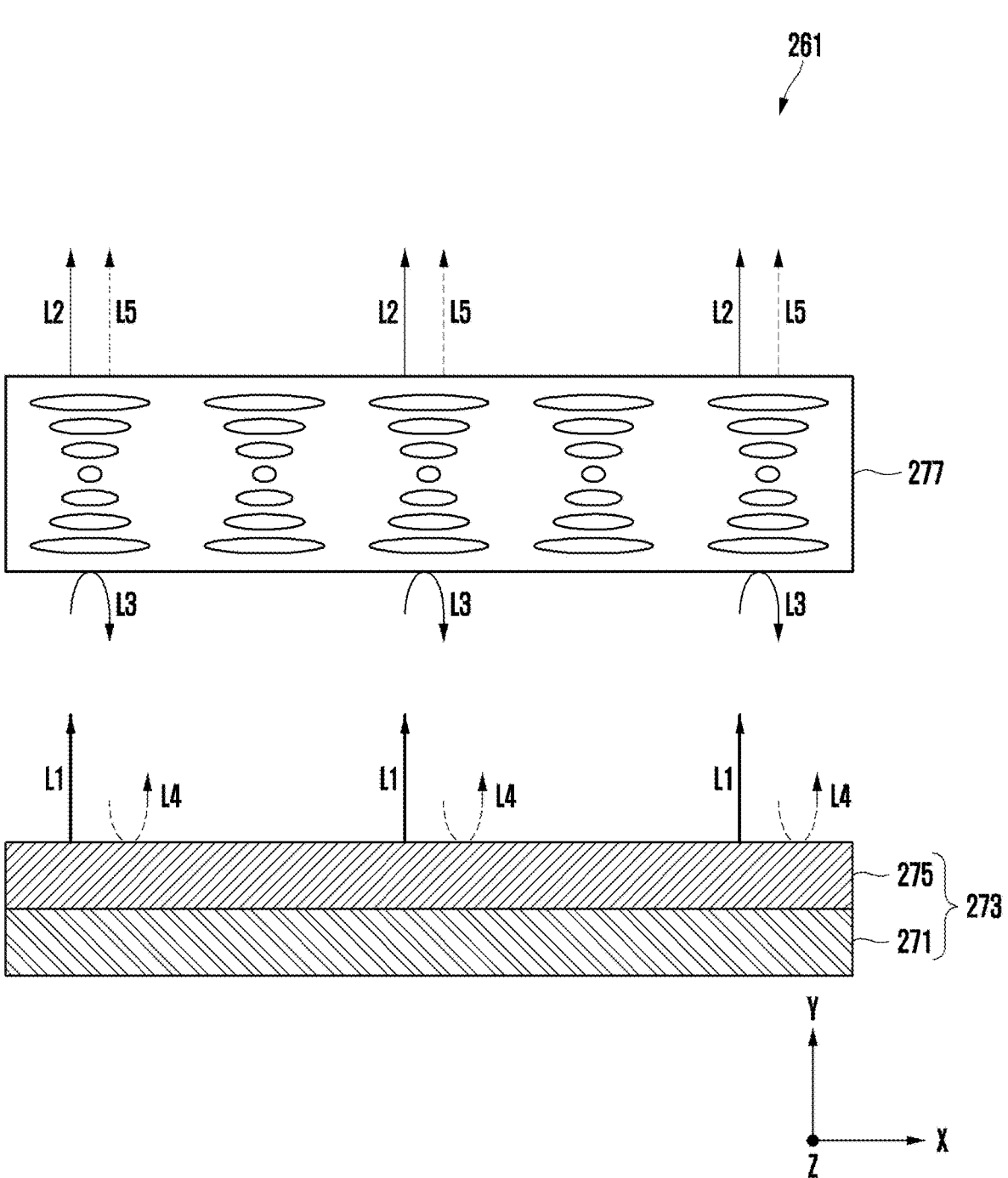
FIG. 6 is a diagram illustrating a structure of a display panel according to an embodiment of the disclosure.

FIG. 6 is a diagram illustrating a structure of a display panel according to an embodiment of the disclosure.

Referring to FIG. 6, at least a portion of light emitted from the display panel 261 may be reflected by the CLC film 277.

In an embodiment of the disclosure, L1 may be light (e.g., the incident light $L_{in}$ of FIG. 5) emitted from the plurality of light-emitting devices 269. L1 may be in a non-polarized state. Hereinafter, a change in an amount of light of L1, starting from 100%, will be described, and it is to be noted that quantified values to be described regarding the amount of light are provided only as examples for ease of explanation.

In an embodiment of the disclosure, L2 may be at least a portion of L1 that has passed through the CLC film 277. For example, an amount of light of L2 may be approximately 50% compared to that of L1. In an embodiment of the disclosure, L2 may be in an LCP state after passing through the CLC film 277.

In an embodiment of the disclosure, L3 may be at least a portion of L1 that has been reflected by the CLC film 277. For example, an amount of light of L3 may be approximately 50% compared to that of L1. In an embodiment of the disclosure, L3 may be reflected by the CLC film 277 and may thus be in an RCP state.

In an embodiment of the disclosure, L4 may be at least a portion of L3 that has been reflected from the substrate 273 toward the CLC film 277. For example, an amount of light in L4 may vary depending on a reflection efficiency of a top surface of the substrate 273 and may be approximately 10% to 50% compared to that of L1. In an embodiment of the disclosure, L3 may be reflected onto the top surface of the substrate 273 and may thus be in the LCP state.

In an embodiment of the disclosure, L5 may be at least a portion of L4 that has passed through the CLC film 277. In an embodiment of the disclosure, L5 may pass through the CLC film 277 and may thus be in the LCP state. L5 and L2 may be light (e.g., the output light $L_{out}$ of FIG. 5) emitted from the display panel 261.

In an embodiment of the disclosure, the display panel 261 may experience a loss in an amount of light during a process in which L3 reflected by the CLC film 277 is reflected onto the substrate 273. In an embodiment of the disclosure, by increasing a light reflection efficiency of the top surface of the substrate 273, the display panel 261 may provide relatively improved luminance and/or color reproduction. For example, in an embodiment of the disclosure, the display panel 261 may include an upper electrode (e.g., an upper electrode 281 of FIG. 7) deposited on the top surface of the substrate 273, of which at least a portion may include a reflective electrode s (e.g., a reflective electrode 281a of FIG. 7), which will be described below with reference to FIG. 7.

Figure 7:
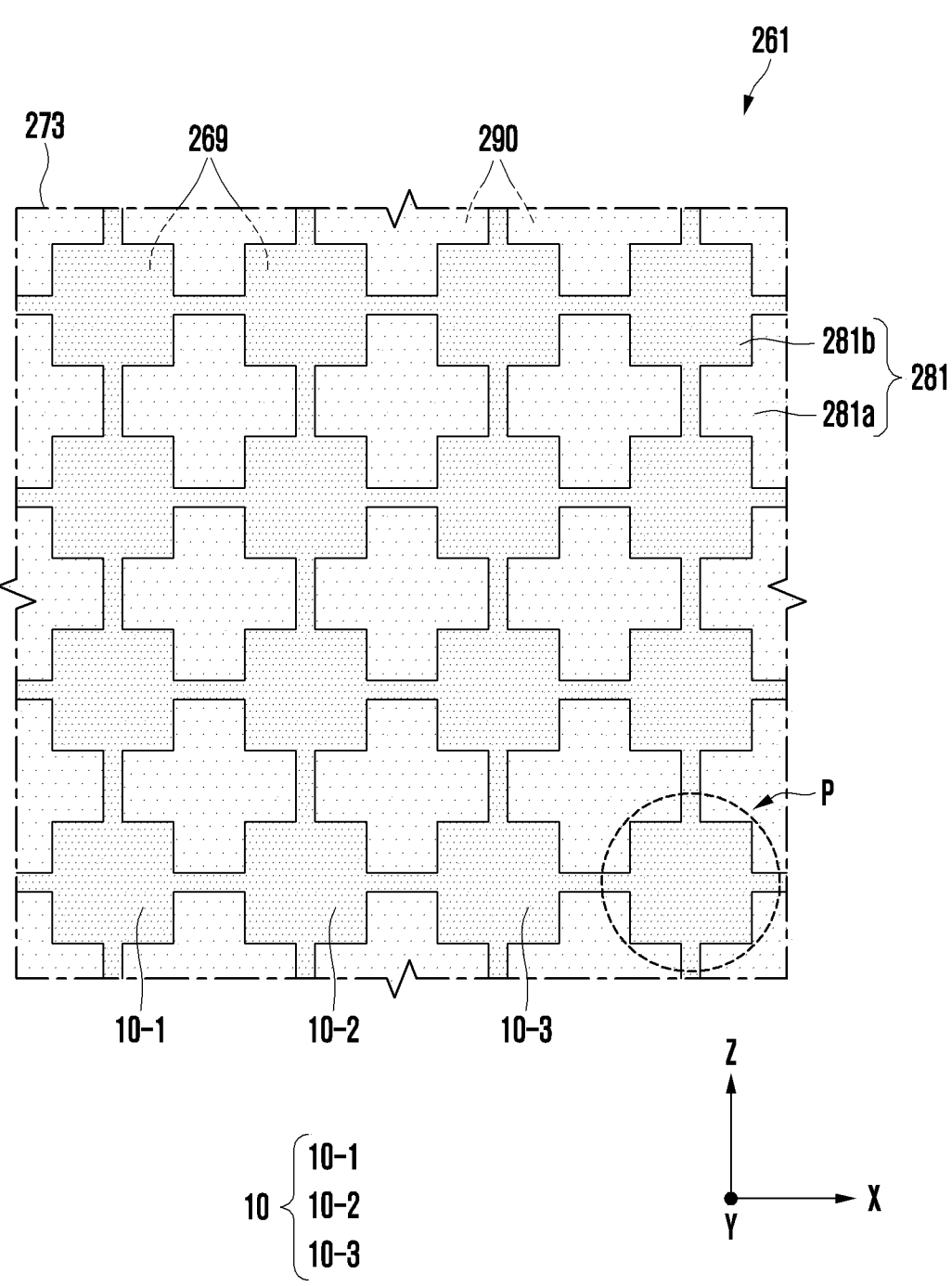
FIG. 7 is a front view of a display panel according to an embodiment of the disclosure.

FIG. 7 is a front view of a display panel according to an embodiment of the disclosure.

Referring to FIG. 7, according to an embodiment of the disclosure, the display panel 261 may include a plurality of light-emitting devices 269 and a PDL bank 290.

In an embodiment of the disclosure, the display panel 261 may include a plurality of subpixels 10-1, 10-2, and 10-3. In this case, some of the plurality of subpixels 10-1, 10-2, and

10-3 may be assembled to form a single pixel 10, and a plurality of pixels 10 may form a screen of the display panel 261.

For example, each of the plurality of pixels 10 may include the plurality of subpixels 10-1, 10-2, and 10-3 including a first subpixel 10-1 that is a red (R) subpixel, a second subpixel 10-2 that is a green (G) subpixel, and a third subpixel 10-3 that is a blue (B) subpixel. In an embodiment of the disclosure, the plurality of subpixels 10-1, 10-2, and 10-3 including the R, G, and B subpixels as one set may constitute one unit pixel 10 of a display module.

In an embodiment of the disclosure, an order of arrangement of the plurality of subpixels 10-1, 10-2, and 10-3 is described as an order of R, G, and B, but the plurality of subpixels 10-1, 10-2, and 10-3 are not necessarily actually arranged in the order of R, G, and B within one pixel 10. In the disclosure, in the description of the plurality of subpixels 10-1, 10-2, and 10-3, the plurality of subpixels 10-1, 10-2, and 10-3 have been described and shown with reference numerals indicating the order of R, B, and G and this is for illustrative purposes only, and an actual order of arrangement thereof may be the same as or different from the illustrated order.

The shape and structure of the plurality of pixels 10 and the plurality of subpixels 10-1, 10-2, and 10-3 shown in FIG. 7 are conceptual spatial divisions for illustrative purposes, but the boundaries of which may not be clear in actual implementations, and they may be implemented in various ways depending on the type and nature of the display panel 261 and the light-emitting devices 269.

Although, in an embodiment of the disclosure, the pixel 10 is described as including the plurality of subpixels 10-1, 10-2, and 10-3 of three types (e.g., the subpixels 10-1, 10-2, and 10-3), the pixel 10 may also be implemented with four types of subpixels, such as, R, G, B, and white (W), or any other number of subpixels (e.g., 10-1, 10-2, and 10-3) may form a single pixel 10. Hereinafter, an example of the pixel 10 including three types (R, G, and B) of subpixels 10-1, 10-2, and 10-3, will be described for ease of explanation.

In an embodiment of the disclosure, each of the plurality of light-emitting devices 269 may be an OLED. Each of the plurality of light-emitting devices 269 may include at least some of an organic film layer (e.g., an organic film layer 280 of FIG. 9), an upper electrode 281, and a lower electrode (e.g., a lower electrode 282 of FIG. 9).

In an embodiment of the disclosure, the PDL bank 290 may define the plurality of subpixels 10-1, 10-2, and 10-3 by partitioning each of the plurality of light-emitting devices 269 while surrounding them. For example, the PDL bank 290 may also be referred to as a "pixel defining membrane."

In an embodiment of the disclosure, the PDL bank 290 may be formed of a light-transmissive material that allows light output from the plurality of light-emitting devices 269 toward a first surface (e.g., a first surface 291 of FIG. 8) to pass therethrough. For example, the PDL bank 290 may be formed of an organic material, such as polyimide, acrylate, or benzocyclobutene series resin. Alternatively, in an embodiment of the disclosure, the PDL bank 290 may be an insulating layer.

In an embodiment of the disclosure, the PDL bank 290 may be formed on only a portion of a top surface of the lower electrode 282, and in areas where the PDL bank 290 is not formed, the organic film layer 280 and the upper electrode 281 may be disposed to form the plurality of subpixels 10-1, 10-2, and 10-3.

In an embodiment of the disclosure, the upper electrode 281 may be disposed on (e.g., +Y direction) the PDL bank 290 and the organic film layer 280. The upper electrode 281 may be a cathode electrode, and the lower electrode 282 may be an anode electrode.

In an embodiment of the disclosure, the upper electrode 281 may include a reflective electrode 281a and a connecting electrode 281b. For example, the reflective electrode 281a may be disposed on a top surface (e.g., a second surface 292 of FIG. 8) of the PDL bank 290, and the connecting electrode 281b may be disposed on a partial surface (e.g., a third surface 293 of FIG. 8) of the organic film layer 280 and the PDL bank 290.

In an embodiment of the disclosure, the reflective electrode 281a may reflect light reflected by the CLC film 277. For example, the reflective electrode 281a may be formed of aluminum (Al), copper (Cu), silver (Ag), nickel (Ni), or an alloy thereof. Alternatively, the reflective electrode 281a may include a reflective film formed of aluminum (Al), copper (Cu), silver (Ag), nickel (Ni), gold (Au), platinum (Pt), tungsten (W), chromium (Cr), molybdenum (Mo), iron (Fe), cobalt (Co), palladium (Pd), titanium (Ti), and an alloy thereof.

In an embodiment of the disclosure, the upper electrode 281 including the reflective electrode 281a may provide improved luminance of output light (e.g., the output light $L_{out}$ of FIG. 5) of the display panel 261. Alternatively, the upper electrode 281 including the reflective electrode 281a may provide a relatively high light reflectance in a situation where light reflected from the CLC film 277 is reflected back onto a substrate (e.g., the substrate 273 of FIG. 5 or 6).

For example, as described above with reference to FIG. 6, in a case of reflecting from L3 reflected by the CLC film 277 to L4 reflected by the substrate 273, the reflective electrode 281a may have a relatively high light reflectance, which may increase an amount of light of L4. In the example of FIG. 6, based on 100% of an amount of light of L1, L4 on the display panel 261 including the reflective electrode 281a may be approximately 50%, and an amount of light of L5 that has passed through the CLC film 277 may be approximately 22.5%.

In an embodiment of the disclosure, incident light $L_{in}$ emitted from the plurality of light-emitting devices 269 of the substrate 273 may be reflected onto the substrate 273 through the upper electrode 281 including the reflective electrode 281a to reduce a light loss, and the display panel 261 may thus provide improved luminance and/or color reproduction.

Figure 8:
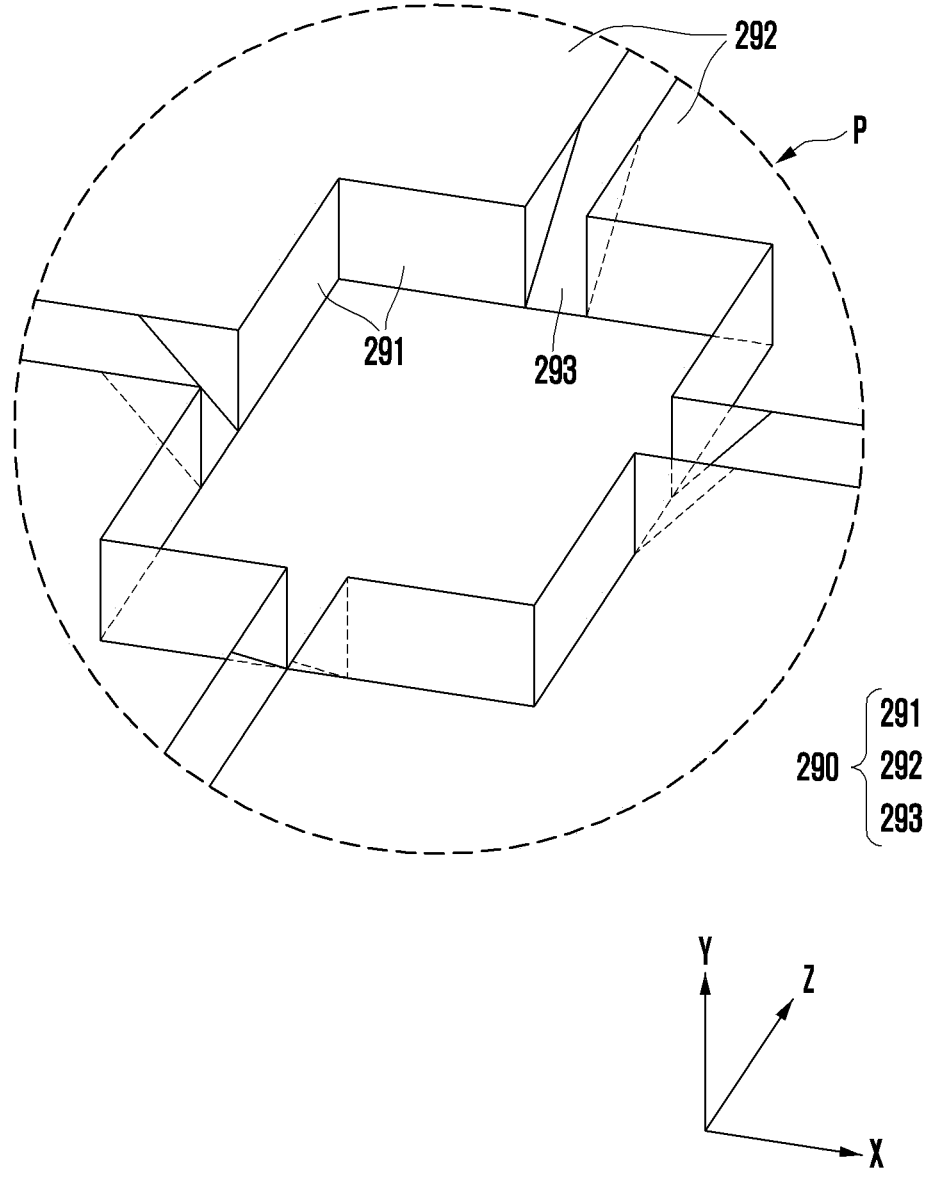
FIG. 8 is a diagram illustrating a pixel define layer (PDL) bank of a display panel according to an embodiment of the disclosure.

FIG. 8 is a diagram illustrating a PDL bank of a display panel according to an embodiment of the disclosure. Specifically, FIG. 8 is a perspective view illustrating only the PDL bank 290 in an area indicated as P shown in FIG. 7.

Referring to FIG. 8, according to an embodiment of the disclosure, the PDL bank 290 may include a first surface 291, a second surface 292, and a third surface 293.

In an embodiment of the disclosure, the first surface 291 may be a surface that surrounds a portion of an outer peripheral surface of each of the plurality of light-emitting devices 269. The first surface 291 may be substantially perpendicular to a reference plane (e.g., an X-Y plane) (e.g., a plane parallel to or along the substrate 273 of FIG. 5 or 6) of the display panel 261. For example, the first surface 291 may have an inclination of approximately 80° to 90° in an upward direction (e.g., +Y direction) relative to a reference plane (e.g., an X-Z plane) parallel to the substrate 273.

In an embodiment of the disclosure, the first surface 291 may limit a viewing angle at which light emitted from the plurality of light-emitting devices 269 spreads out from the substrate 273. For example, the first surface 291 may limit an angle of the incident light $L_{in}$ of FIG. 5 to an angle close to 90°. When the angle of the incident light $L_{in}$ nears 90°, it may reduce or prevent a change in a wavelength of light while the light passes through the CLC film 277. The PDL bank 290 including the first surface 291 may allow the display panel 261 to provide clear color reproduction.

In an embodiment of the disclosure, the second surface 292 may be a surface facing the CLC film 277. The second surface 292 may be a top surface of the PDL bank 290 that extends from the first surface 291, and in this case, the first surface 291 may be a portion of sides of the PDL bank 290. In an embodiment of the disclosure, the second surface 292 may be substantially parallel to the substrate 273. On the second surface 292, the reflective electrode 281a of the upper electrode 281 may be disposed.

In an embodiment of the disclosure, the third surface 293 may be a surface that surrounds a portion of the outer peripheral surface of each of the plurality of light-emitting devices 269 that is different from the first surface 291. In an embodiment of the disclosure, the third surface 293 may be inclined at a predetermined angle from the substrate 273. For example, the third surface 293 may be inclined at an angle of approximately 30° to 45° in an upward direction (e.g., +Y direction) relative to a plane (e.g., X-Z plane) parallel to the substrate 273.

In an embodiment of the disclosure, the third surface 293 may be a surface extending from one light-emitting device 269 to another adjacent light-emitting device 269. Alternatively, the third surface 293 may be a surface on which the connecting electrode 281b for connecting the plurality of light-emitting devices 269 is disposed.

In an embodiment of the disclosure, in a case where the first surface 291 surrounds all areas of the outer peripheral surface of each of the plurality of light-emitting devices 269, without the third surface 293, the connecting electrode 281b may be bent or curved at around 90° at an edge that is a boundary between the first surface 291 and the second surface 292. Such a bent or curved connecting electrode 281b may be broken or disconnected. In an embodiment of the disclosure, the PDL bank 290 including the third surface 293 may have a structure that is inclined at a predetermined angle such that the connecting electrode 281b is relatively less likely to be bent or curved by the third surface 293.

Figure 9:
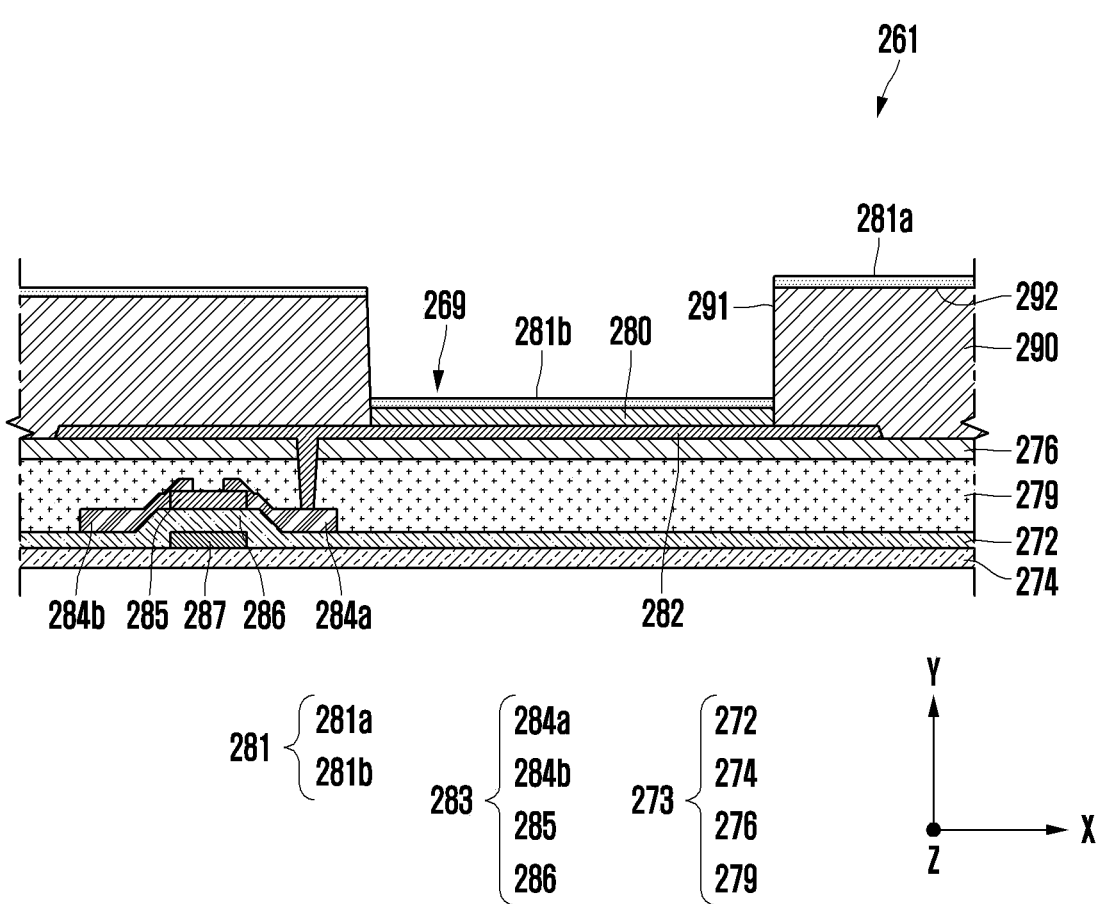
FIG. 9 is a cross-sectional view of a display panel according to an embodiment of the disclosure.

FIG. 9 is a cross-sectional view of a display panel according to an embodiment of the disclosure.

Referring to FIG. 9, according to an embodiment of the disclosure, the display panel 261 may include a lower electrode 282 and a thin-film transistor 283. Although FIG. 9 shows a schematic cross-sectional structure of the display panel 261 for one subpixel (e.g., 10-1, 10-2, or 10-3), a portion of the structure may be omitted or changed, or other components may be added, in actual implementations.

In an embodiment of the disclosure, the substrate 273 may include at least some of the following: a planarization film 276 (e.g., a passivation film), an insulating film 279, and a plurality of buffer layers 272 and 274. For example, at least some of the planarization film 276, the insulating film 279, and the plurality of buffer layers 272 and 274 may constitute at least a portion of a multi-layer rear substrate (e.g., the rear substrate 271 of FIG. 5).

In an embodiment of the disclosure, the lower electrode 282 may be disposed on a top surface of the planarization film 276. The planarization film 276 may have a via hole formed therein, through which the lower electrode 282 may be connected to the thin-film transistor 283. In an embodiment of the disclosure, the thin-film transistor 283 may be disposed in the insulating film 279.

In an embodiment of the disclosure, the plurality of buffer layers 272 and 274 may include a first buffer layer 272 and a second buffer layer 274. The plurality of buffer layers 272 and 274 may protect the thin-film transistor 283. Between the first buffer layer 272 and the second buffer layer 274, a shield layer 287 may be formed. The shield layer 287 may be formed in an area corresponding to the thin-film transistor 283 and may prevent a loss of current for driving the display panel 261.

In an embodiment of the disclosure, the thin-film transistor 283 may include at least some of a drain electrode 284a, a source electrode 284b, a gate electrode 285, and a semiconductor layer 286. The thin-film transistor 283 may be provided as a plurality of thin-film transistors respectively corresponding to a plurality of subpixels (e.g., 10-1, 10-2, and 10-3). The thin-film transistor 283 may be connected to the lower electrode 282. The thin-film transistor 283 may be connected to an IC chip or the processor 120 of the display panel 261 and may receive input signals to control the driving of the plurality of light-emitting devices 269.

In an embodiment of the disclosure, the lower electrode 282 may be formed of the same material as the reflective electrode 281a. The lower electrode 282 may reflect light emitted by the organic film layer 280 in an upward direction (e.g., +Y direction). Alternatively, in an embodiment of the disclosure, the lower electrode 282 may be formed of a transparent conductive material.

In an embodiment of the disclosure, the organic film layer 280 may include a luminescent material, such as, a luminescent layer in which electrons and holes combine to emit light. Although not shown, a hole transport layer and a hole injection layer may be formed between the organic film layer 280 and the lower electrode 282, and an electron transport layer and an electron injection layer may be formed between the organic film layer 280 and the connecting electrode 281b of the upper electrode 281.

In an embodiment of the disclosure, the PDL bank 290 may include a first surface 291 substantially perpendicular to the substrate 273 and a second surface 292 substantially parallel to the substrate 273. In an embodiment of the disclosure, the first surface 291 may limit a viewing angle of light emitted from the light-emitting devices 269 and guide it in a straight direction (e.g., +Y direction).

In an embodiment of the disclosure, the second surface 292 may have a reflective electrode 281a disposed thereon, which may reflect light reflected by the CLC film 277 back to the CLC film 277. The reflective electrode 281a disposed on the second surface 292 may allow the display panel 261 to provide improved luminance and/or color reproduction.

For example, in a case where the display panel 261 is used in the wearable device 200, a distance between the user and the display panel 261 may be close. At a close distance from the user, the display panel 261 may be relatively free to implement a viewing angle. In an embodiment of the disclosure, the wearable device 200 may use a narrow viewing angle to provide high-definition and high-luminance images by the PDL bank 290 and the upper electrode 281 described above.

Figure 10:
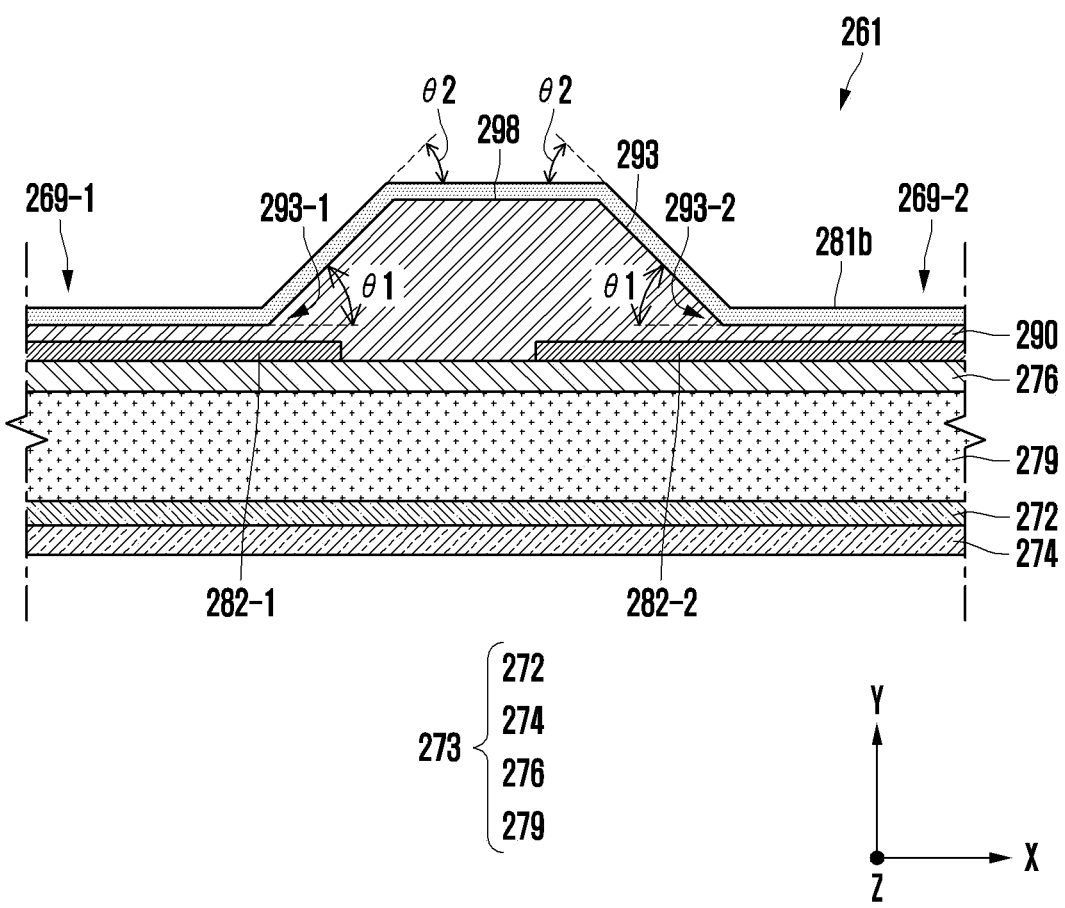
FIG. 10 is a cross-sectional view of a display panel according to an embodiment of the disclosure.

FIG. 10 is a cross-sectional view of a display panel according to an embodiment of the disclosure.

Referring to FIG. 10, according to an embodiment of the disclosure, the third surface 293 of the PDL bank 290 may include at least some of a first end 293-1, a second end 293-2, and a middle area 298.

In an embodiment of the disclosure, the plurality of light-emitting devices 269 may include a first light-emitting device 269-1 and a second light-emitting device 269-2 that are adjacent to each other. The first light-emitting device 269-1 may include a first organic film layer 282-1 that radiates in one color among red (R), green (G), and blue (b). The second light-emitting device 269-2 may include a second organic film layer 282-2 that radiates in another color different from that of the first organic film layer 282-1.

In an embodiment of the disclosure, the third surface 293 may connect the first light-emitting device 269-1 and the second light-emitting device 269-2. For example, a connecting electrode 281b may be disposed on the first light-emitting device 269-1, the third surface 293, and the second light-emitting device 269-2, and the first light-emitting device 269-1 and the second light-emitting device 269-2 may be electrically connected through the connecting electrode 281b.

In an embodiment of the disclosure, the third surface 293 may include the first end 293-1 that faces a portion of an outer peripheral surface of the first light-emitting device 269-1 and the second end 293-2 that is opposite the first end 293-1 and faces a portion of an outer peripheral surface of the second light-emitting device 269-2.

In an embodiment of the disclosure, the first end 293-1 and the second end 293-2 may form an inclination along which the connecting electrode 281b is deposited and bent. The connecting electrode 281b may be stably deposited along the inclination of the first end 293-1 and the second end 293-2. For example, an angle $\theta 1$ at which the first end 293-1 and the second end 293-2 are inclined from a reference plane (e.g., the substrate 273 or the X-Y plane) may be approximately 30° to 45°.

In an embodiment of the disclosure, in a case where the first end 293-1 and the second end 293-2 are bent from the substrate 273 at an angle substantially perpendicular or close thereto or bent at an angle greater than or equal to 90°, the connecting electrode 281b may be broken or disconnected in an area corresponding to the first end 293-1 and the second end 293-2. In an embodiment of the disclosure, as the third surface 293 is relatively smooth and gently inclined, the connecting electrode 281b may be stably disposed.

In an embodiment of the disclosure, the third surface 293 may include the middle area 298 that is disposed between the first end 293-1 and the second end 293-2 and is substantially parallel to the second surface 292. In an embodiment of the disclosure, as shown in the first end 293-1 and the second end 293-2, the connecting electrode 281b may be stably deposited against an inclination of both ends of the middle area 298. For example, an angle $\theta 2$ at which both ends of the middle area 298 are inclined from an adjacent area or a reference plane (e.g., the substrate 273 or the X-Y plane) may be approximately 30° to 45°.

However, examples are not limited thereto, and the middle area 298 of the third surface 293 may form a curved surface, although not shown. Such a curved structure of the third surface 293 may allow the connecting electrode 281b to be deposited on the top relatively more stably, compared to the inclined structure.

According to various embodiments of the disclosure, a wearable device 200 including a display panel 261 is provided. The display panel 261 may include a plurality of light-emitting devices 269, a substrate 273 on which the plurality of light-emitting devices 269 is disposed, a PDL bank 290 surrounding and partitioning each of the plurality of light-emitting devices 269 to define a plurality of subpixels 10-1, 10-2, and 10-3, and a CLC film 277 disposed on the substrate 273 and configured to convert light output from the plurality of light-emitting devices 269 into circularly polarized light. In an embodiment of the disclosure, each of the plurality of light-emitting devices 269 may include an organic film layer 280, an upper electrode 281 disposed on the organic film layer 280 and the PDL bank 290, and a lower electrode 282 disposed under the organic film layer 280 and the PDL bank 290. In an embodiment of the disclosure, the PDL bank 290 may include: a first surface 291 substantially perpendicular to the substrate 273, surrounding a portion of an outer peripheral surface of each of the plurality of light-emitting devices 269, and a second surface 292 facing the CLC film 277 and substantially parallel to the substrate 273.

In an embodiment of the disclosure, the PDL bank 290 may include a third surface 293 surrounding a portion of the outer peripheral surface of each of the plurality of light-emitting devices 269 that is different from the first surface 291, and inclined at a predetermined angle from the substrate 273. In an embodiment of the disclosure, the third surface 293 may extend from one light-emitting device 269 to another adjacent light-emitting device 269.

In an embodiment of the disclosure, the upper electrode 281 may include a reflective electrode 281a disposed on the second surface 292 of the PDL bank 290 and configured to reflect light reflected by the CLC film 277, and a connecting electrode 281b disposed on the organic film layer 280 and the third surface 293 and configured to connect the plurality of light-emitting devices 269.

In an embodiment of the disclosure, the reflective electrode 281a may be formed of substantially the same material as the lower electrode 282.

In an embodiment of the disclosure, the plurality of light-emitting devices 269 may include a first light-emitting device 269-1 and a second light-emitting device 269-2 that are adjacent to each other. In an embodiment of the disclosure, the third surface 293 may include: a first end 293-1 facing a portion of an outer peripheral surface of the first light-emitting device 269-1, and a second end 293-2 opposite the first end 293-1 and facing a portion of an outer peripheral surface of the second light-emitting device 269-2.

In an embodiment of the disclosure, the first end 293-1 and the second end 293-2 may be formed to be inclined at an angle between 30° and 45° from the substrate 273.

In an embodiment of the disclosure, the third surface 293 may include a middle area 298 disposed between the first end 293-1 and the second end 293-2, and substantially parallel to the second surface 292. In an embodiment of the disclosure, the third surface 293 may be formed to be inclined at an angle between 30° and 45° from an adjacent area, at both ends of the middle area 298.

In an embodiment of the disclosure, the PDL bank 290 may be formed of a light-transmissive material through which, of the light output from the plurality of light-emitting devices 269, light output toward the first surface 291 passes.

In an embodiment of the disclosure, the substrate 273 may include a rear substrate 271 formed of a silicon wafer, on which a thin-film transistor 283 is disposed, and a front substrate 275 disposed on the rear substrate 271, on which the plurality of light-emitting devices 269 and the PDL bank 290 are disposed.

In an embodiment of the disclosure, the wearable device 200 may include: a housing 210, and a pair of lenses 263 disposed in the housing 210. In an embodiment of the disclosure, the display panel 261 may be disposed inside the housing 210 and configured to emit light toward the pair of lenses 263.

In an embodiment of the disclosure, the wearable device 200 may include a plurality of cameras 230a, 230b, 230c, and 230d configured to capture an image of the outside of the housing 210, and a processor 120 configured to receive input data from the plurality of cameras 230a, 230b, 230c, and 230d and transmit output data to the display panel 261.

In an embodiment of the disclosure, the housing 210 may include: a first surface 211a, and a second surface 211b opposite the first surface 211a, the second surface 211b on which the pair of lenses 263 is disposed. In an embodiment of the disclosure, the plurality of cameras 230a, 230b, 230c, and 230d may include a plurality of front cameras 230a and 230b spaced apart on the first surface 211a of the housing 210, and configured to capture an image in a direction in which the first surface 211a of the housing 210 faces.

In an embodiment of the disclosure, the plurality of cameras 230a, 230b, 230c, and 230d may include an eye-tracking camera 230c disposed on the second surface 211b of the housing 210 and configured to detect a movement of an object viewing the display panel 261.

In an embodiment of the disclosure, the processor 120 may be configured to combine data input from the plurality of front cameras 230a and 230b and process the combined data to control the display panel 261.

According to various embodiments of the disclosure, a display panel 261 is provided, which includes a plurality of light-emitting devices 269, a substrate 273 on which the plurality of light-emitting devices 269 is disposed, a PDL bank 290 surrounding and partitioning each of the plurality of light-emitting devices 269 to define a plurality of sub-pixels 10-1, 10-2, and 10-3, and a CLC film 277 disposed on the substrate 273 and configured to convert light output from the plurality of light-emitting devices 269 into circularly polarized light. In an embodiment of the disclosure, each of the plurality of light-emitting devices 269 may include an organic film layer 280, an upper electrode 281 disposed on the organic film layer 280 and the PDL bank 290, and a lower electrode 282 disposed under the organic film layer 280 and the PDL bank 290. In an embodiment of the disclosure, the PDL bank 290 may include a first surface 291 substantially perpendicular to the substrate 273, surrounding a portion of an outer peripheral surface of each of the plurality of light-emitting devices 269, a second surface 292 facing the CLC film 277 and substantially parallel to the substrate 273, and a third surface 293 surrounding a portion of the outer peripheral surface of each of the plurality of light-emitting devices 269 that is different from the first surface 291, inclined at a predetermined angle from the substrate 273, and extending from one light-emitting device 269 to another adjacent light-emitting device 269. In an embodiment of the disclosure, the upper electrode 281 may include a reflective electrode 281a disposed on the second surface 292 of the PDL bank 290 and configured to reflect light reflected by the CLC film 277, and a connecting electrode 281b disposed on the organic film layer 280 and the third surface 293 and connecting the plurality of light-emitting devices 269.

In an embodiment of the disclosure, the plurality of light-emitting devices 269 may include a first light-emitting device 269-1 and a second light-emitting device 269-2 that are adjacent to each other, and the third surface 293 may include a first end 293-1 facing a portion of an outer peripheral surface of the first light-emitting device 269-1, and a second end 293-2 opposite the first end 293-1 and facing a portion of an outer peripheral surface of the second light-emitting device 269-2.

In an embodiment of the disclosure, the first end 293-1 and the second end 293-2 may be formed to be inclined at an angle between 30° and 45° from the substrate 273.

In an embodiment of the disclosure, the third surface 293 may include a middle area 298 disposed between the first end 293-1 and the second end 293-2 and substantially parallel to the second surface 292.

In an embodiment of the disclosure, the third surface 293 may be formed to be inclined at an angle between 30° and 45° from an adjacent area, at both ends of the middle area 298.

It will be appreciated that various embodiments of the disclosure according to the claims and description in the specification can be realized in the form of hardware, software or a combination of hardware and software.

Any such software may be stored in non-transitory computer readable storage media. The non-transitory computer readable storage media store one or more computer programs (software modules), the one or more computer programs include computer-executable instructions that, when executed by one or more processors of an electronic device, cause the electronic device to perform a method of the disclosure.

Any such software may be stored in the form of volatile or non-volatile storage, such as, for example, a storage device like read only memory (ROM), whether erasable or rewritable or not, or in the form of memory, such as, for example, random access memory (RAM), memory chips, device or integrated circuits or on an optically or magnetically readable medium, such as, for example, a compact disk (CD), digital versatile disc (DVD), magnetic disk or magnetic tape or the like. It will be appreciated that the storage devices and storage media are various embodiments of non-transitory machine-readable storage that are suitable for storing a computer program or computer programs comprising instructions that, when executed, implement various embodiments of the disclosure. Accordingly, various embodiments provide a program comprising code for implementing apparatus or a method as claimed in any one of the claims of this specification and a non-transitory machine-readable storage storing such a program.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. A wearable device comprising:
a display panel,
wherein the display panel comprises:
   a plurality of light-emitting devices,
   a substrate on which the plurality of light-emitting devices is disposed,
   a pixel define layer (PDL) bank surrounding and partitioning each of the plurality of light-emitting devices to define a plurality of subpixel areas, and
   a cholesteric liquid crystal (CLC) film disposed on the substrate and configured to convert light output from the plurality of light-emitting devices into circularly polarized light,
wherein each of the plurality of light-emitting devices comprises:
   an organic film layer,
   an upper electrode disposed on the organic film layer and the PDL bank, and
   a lower electrode disposed under the organic film layer and the PDL bank, and wherein the PDL bank comprises:
   a first surface perpendicular to the substrate, surrounding a portion of an outer peripheral surface of each of the plurality of light-emitting devices, and
   a second surface facing the CLC film and parallel to the substrate.
2. The wearable device of claim 1,
wherein the PDL bank comprises:
   a third surface surrounding a portion of the outer peripheral surface of each of the plurality of light-emitting devices that is different from the first surface, and inclined at a predetermined angle from the substrate, and
wherein the third surface extends from one light-emitting device to another adjacent light-emitting device.
3. The wearable device of claim 2, wherein the upper electrode comprises:
   a reflective electrode disposed on the second surface of the PDL bank and configured to reflect light reflected by the CLC film; and
   a connecting electrode disposed on the organic film layer and the third surface and configured to connect the plurality of light-emitting devices.
4. The wearable device of claim 3, wherein the reflective electrode is formed of the same material as the lower electrode.
5. The wearable device of claim 2,
wherein the plurality of light-emitting devices comprises a first light-emitting device and a second light-emitting device that are adjacent to each other, and
wherein the third surface comprises:
   a first end facing a portion of an outer peripheral surface of the first light-emitting device, and
   a second end opposite the first end and facing a portion of an outer peripheral surface of the second light-emitting device.
6. The wearable device of claim 5, wherein the first end and the second end are formed to be inclined at an angle between 30 degrees (°) and 45° from the substrate.
7. The wearable device of claim 5, wherein the third surface comprises:
   a middle area disposed between the first end and the second end, and parallel to the second surface.
8. The wearable device of claim 7, wherein the third surface is formed to be inclined at an angle between 30° and 45° from an adjacent area, at both ends of the middle area.
9. The wearable device of claim 1, wherein the PDL bank is formed of a light-transmissive material through which, of the light output from the plurality of light-emitting devices, light output toward the first surface passes.
10. The wearable device of claim 1, wherein the substrate comprises:
   a rear substrate formed of a silicon wafer, on which a thin-film transistor is disposed; and
   a front substrate disposed on the rear substrate, on which the plurality of light-emitting devices and the PDL bank are disposed.
11. The wearable device of claim 1, further comprising:
a housing; and
a pair of lenses disposed in the housing,
wherein the display panel is disposed inside the housing and configured to emit light toward the pair of lenses.
12. The wearable device of claim 11, further comprising:
a plurality of cameras configured to capture an image of the outside of the housing;
memory storing one or more computer programs; and
one or more processors communicatively coupled to the plurality of cameras and the memory, wherein the one or more computer programs include computer-executable instructions that, when executed by the one or more processors individually or collectively, cause the wearable device to:

receive input data from the plurality of cameras, and transmit output data to the display panel.

13. The wearable device of claim 12, wherein the housing comprises:

a first surface, and a second surface opposite the first surface, the second surface on which the pair of lenses is disposed, and wherein the plurality of cameras comprises:

a plurality of front cameras spaced apart on the first surface of the housing, and configured to capture an image in a direction in which the first surface of the housing faces.

14. The wearable device of claim 13, wherein the plurality of cameras comprises:

an eye-tracking camera disposed on the second surface of the housing, and configured to detect a movement of an object viewing the display panel.

15. The wearable device of claim 13, wherein the one or more computer programs further include computer-executable instructions that, when executed by the one or more processors individually or collectively, cause the wearable device to:

combine data input from the plurality of front cameras; and process the combined data to control the display panel.

16. A display panel comprising:

a plurality of light-emitting devices;

a substrate on which the plurality of light-emitting devices is disposed;

a pixel define layer (PDL) bank surrounding and partitioning each of the plurality of light-emitting devices to define a plurality of subpixel areas; and a cholesteric liquid crystal (CLC) film disposed on the substrate and configured to convert light output from the plurality of light-emitting devices into circularly polarized light, wherein each of the plurality of light-emitting devices comprises:

an organic film layer, an upper electrode disposed on the organic film layer and the PDL bank, and a lower electrode disposed under the organic film layer and the PDL bank, wherein the PDL bank comprises:

a first surface perpendicular to the substrate, surrounding a portion of an outer peripheral surface of each of the plurality of light-emitting devices, a second surface facing the CLC film and parallel to the substrate, and a third surface surrounding a portion of the outer peripheral surface of each of the plurality of light-emitting devices that is different from the first surface, inclined at a predetermined angle from the substrate, and extending from one light-emitting device to another adjacent light-emitting device, and wherein the upper electrode comprises:

a reflective electrode disposed on the second surface of the PDL bank and configured to reflect light reflected by the CLC film, and a connecting electrode disposed on the organic film layer and the third surface and connecting the plurality of light-emitting devices.

17. The display panel of claim 16, wherein the plurality of light-emitting devices comprises a first light-emitting device and a second light-emitting device that are adjacent to each other, and wherein the third surface comprises:

a first end facing a portion of an outer peripheral surface of the first light-emitting device, and a second end opposite the first end and facing a portion of an outer peripheral surface of the second light-emitting device.

18. The display panel of claim 17, wherein the first end and the second end are formed to be inclined at an angle between 30 degrees (°) and 45° from the substrate.

19. The display panel of claim 17, wherein the third surface comprises:

a middle area disposed between the first end and the second end, and parallel to the second surface.

20. The display panel of claim 19, wherein the third surface is formed to be inclined at an angle between 30° and 45° from an adjacent area, at both ends of the middle area.

* * * * *